(12) United States Patent
Asakawa

(10) Patent No.: US 8,025,473 B2
(45) Date of Patent: Sep. 27, 2011

(54) CARRYING SYSTEM, SUBSTRATE TREATING DEVICE, AND CARRYING METHOD

(75) Inventor: Teruo Asakawa, Tokyo (JP)

(73) Assignee: Tokyo Electron Limited (JP)

( * ) Notice: Subject to any disclaimer, the term of this patent is extended or adjusted under 35 U.S.C. 154(b) by 873 days.

(21) Appl. No.: 11/666,163

(22) PCT Filed: Oct. 25, 2005

(86) PCT No.: PCT/JP2005/019632
§ 371 (c)(1),
(2), (4) Date: Mar. 7, 2008

(87) PCT Pub. No.: WO2006/046580
PCT Pub. Date: May 4, 2006

(65) Prior Publication Data
US 2009/0016859 A1      Jan. 15, 2009

(30) Foreign Application Priority Data

Oct. 25, 2004   (JP) ................................. 2004-310143

(51) Int. Cl.
  *B65G 1/00*   (2006.01)
  *B65G 49/06*  (2006.01)
  *H01L 21/68*  (2006.01)
(52) U.S. Cl. ................. 414/221; 414/222.07; 198/346.2
(58) Field of Classification Search ............... 198/346.2, 198/860.3, 860.5; 414/221, 222.07
See application file for complete search history.

(56) References Cited

U.S. PATENT DOCUMENTS

| 5,772,386 | A  | * | 6/1998 | Mages et al. ................... 414/411 |
| 6,090,176 | A  | * | 7/2000 | Yoshitake et al. ........... 55/385.4 |
| 6,235,634 | B1 | * | 5/2001 | White et al. ................... 438/680 |
| 6,425,722 | B1 | * | 7/2002 | Ueda et al. ..................... 414/217 |

(Continued)

FOREIGN PATENT DOCUMENTS

GB          2 362 373 B      3/2003

(Continued)

OTHER PUBLICATIONS

Notification of Reasons for Refusal from the Japanese Patent Office in counterpart Japanese Patent Appln No. 2006-543182, mailed Apr. 20, 2010, 3 pages.

(Continued)

*Primary Examiner* — Douglas A Hess
(74) *Attorney, Agent, or Firm* — Finnegan, Henderson, Farabow, Garrett & Dunner, L.L.P.

(57) ABSTRACT

A carrying system 1 has a carrying path which is laid out in such a manner as to pass through the lower sides of loading table 11 and the like provided at the front face side of treating devices 10, 100, 200, and covered by a cover 5. As the carrying path is positioned below the loading tables, the occupying areas of the loading table 11 and the like and portions of the region of the carrying path are shared so that space saving is achieved, and the accessibility to the treating device 10, 100 or the like from the front side thereof is improved, thereby realizing a layout which facilitates maintenance. A loading surface 11*d* or the like of the loading table 11 is set to a height which allows a conventional overhead-type carrying system 2 and unmanned carrying vehicle 3 of a floor-type carrying system to load an object on the loading surface, thereby ensuring the co-existence with the other carrying systems.

18 Claims, 23 Drawing Sheets

U.S. PATENT DOCUMENTS

| | | | |
|---|---|---|---|
| 6,493,961 B2 * | 12/2002 | Ishii | 34/82 |
| 7,278,813 B2 * | 10/2007 | Davis et al. | 414/416.03 |
| 7,410,340 B2 * | 8/2008 | Bonora et al. | 414/217.1 |
| 7,419,346 B2 * | 9/2008 | Danna et al. | 414/222.11 |
| 7,506,749 B2 * | 3/2009 | Fukazawa et al. | 198/582 |
| 7,651,307 B2 * | 1/2010 | Bonora et al. | 414/217.1 |

FOREIGN PATENT DOCUMENTS

| | | |
|---|---|---|
| JP | 63-37027 | 2/1988 |
| JP | 6-16206 | 1/1994 |
| JP | 11-145243 | 5/1999 |
| JP | 2000-323548 | 11/2000 |
| JP | 2001-189366 | 7/2001 |
| JP | 2002-237512 | 8/2002 |
| JP | 2003-86668 | 3/2003 |
| JP | 2003-237940 | 8/2003 |
| JP | 2003-282669 | 10/2003 |
| WO | WO 01/94245 A1 | 12/2001 |

OTHER PUBLICATIONS

European Search Report dated Jun. 17, 2009.

* cited by examiner

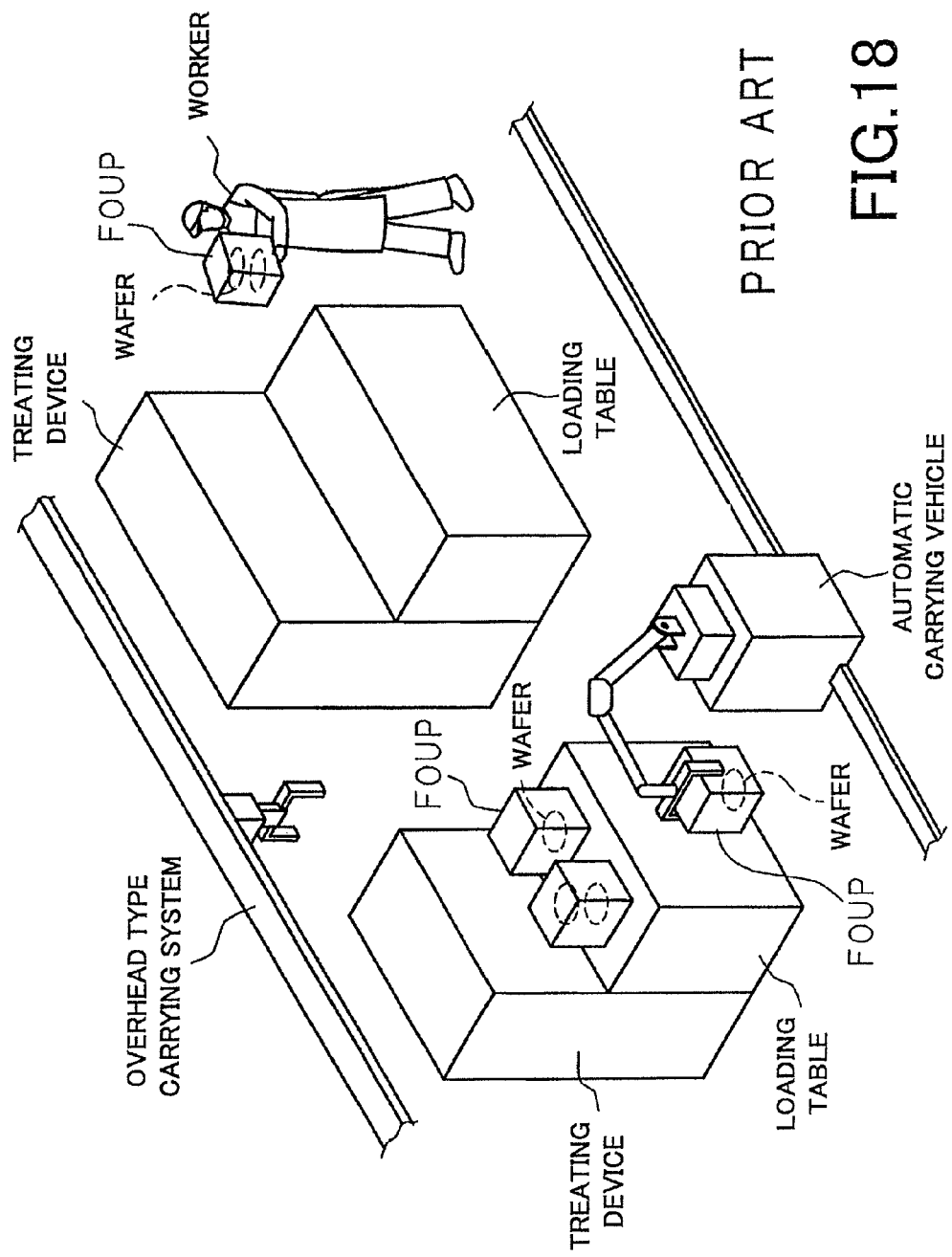

CARRYING SYSTEM, SUBSTRATE TREATING DEVICE, AND CARRYING METHOD

TECHNICAL FIELD

The present invention relates to a carrying system relating to a product in a manufacturing facility, a substrate treating device and a carrying method, and more particularly, realizes a carrying mode which can be used together with a conventional carrying system used in the production facility while enabling space-saving and improvement of ease of maintenance.

BACKGROUND ART

Conventionally, a carrying system which carries a product (work) is built in various manufacturing facilities. For example, in a facility where a work in a substrate form, such as a wafer or a liquid crystal panel, is manufactured, a system which can carry the works by a single work or by cassettes is present. A system of this type is disclosed in, for example, Unexamined Japanese Patent Application KOKAI Publication No. H6-16206, Unexamined Japanese Patent Application KOKAI Publication No. 2002-237512, Unexamined Japanese Patent Application KOKAI Publication No. 2003-282669, Unexamined Japanese Patent Application KOKAI Publication No. 2001-189366, and Unexamined Japanese Patent Application KOKAI Publication No. 2003-86668.

DISCLOSURE OF INVENTION

Problem to be Solved by the Invention

FIG. 18 shows an example of the specific structure of a conventional and general carrying system in a wafer manufacturing facility. In the facility, treatment devices are installed and disposed for each process (manufacturing process, measurement process, inspection process, storing process, and the like) necessary for a wafer. A loading table (load port corresponds to this) on which a sealed container (called FOUP) is put is provided at the front of each treatment device. A overhead-type carrying system is provided above each loading table, or a flooring carrying system comprising an automatic carrying vehicle (AGV: Automated Guided Vehicle) provided at the front of each loading table is provided.

An FOUP containing wafers is conveyed by the overhead-type carrying system or the AGV, and loaded on the loading table. In some cases, a worker carries the FOUP containing wafers to the loading table. Because of increment of demands for wide-variety-of-products-in-small-quantity, recently, there is proposed a single wafer carrying device of a circulative carrying path type or the like in addition to the foregoing carrying systems.

The circulation type carrying system has a carrying path laid down ahead of the loading table. Accordingly, areas of the loading table and the carrying path in the floor of the facility increase, and the floor area of the facility is not used effectively. When a person in charge checks and repairs the treatment device from the front side thereof, a distance to the treatment device is far because the loading table and the carrying path are present between the person and the treatment device, so that it is difficult to carry out a treatment.

Further, a structure such that the carrying path is present ahead of the loading table, and differences in carrying units (carrying numbers) and shapes of objects (containers) to be carried limit the layout and access distance of the carrying system. Therefore, the circulation type carrying system may have a difficulty in transferring an object to be carried with the generally-used conventional overhead-type carrying system and flooring carrying system which uses an FOUP.

The present invention has been made in view of the foregoing circumstances, and it is an object of the invention to provide a carrying system having a small occupation area, a substrate treating device, and a carrying method.

It is another object of the invention to provide a carrying system, a substrate treating device, and a carrying method which enable communization of an area where a loading table occupies and an area where a carrying path is laid down.

Further, it is the other object of the invention to provide a carrying system, a substrate treating device, and a carrying method which ensure an effective carrying mode even if a place where the carrying path is laid down is changed.

Means for Solving the Problem

To achieve the object, a carrying system of the first invention comprises a carrying path where carrying objects are successively carried single carrying object by single carrying object or plural carrying objects by plural carrying objects, and a loading table having one or a plurality of loading regions in a loading surface on which the carrying object can be loaded, and wherein the carrying path is laid out below the loading surface of the loading table in such a manner as to run across a space region where a floor-occupying portion of the loading table is projected in a vertical direction; and the carrying system further comprises a moving unit which moves a carrying object, which is carried through the carrying path and passes through the space region, to that position where another carrying object does not interfere.

According to the first invention, the carrying path is laid out below the loading surface in such a manner as to run across the space region of the loading table. Therefore, the occupying region of the loading table and the laid-out region of the carrying path are shared, thereby realizing space saving. The carrying path is not located ahead of the loading table, and this facilitates accessing to the loading table from the device front face in inspecting and repairing. The limitation of a layout is reduced, and the affinity and compatibility with the other carrying systems are improved. Further, because there is the moving unit which moves one carrying object passing through the space region of the loading table to that position where no interference with another carrying object occurs, the carried carrying object can be moved for a process or the like without any problem with carrying, so that the carrying object in carrying can be moved smoothly for various processes.

According to a carrying system of the second invention, the carrying path can carry the carrying objects in a combined unit of carrying of a unit of singular carrying and a unit of plural carryings, and the moving unit is structured in such a manner as to move the carrying object by a moving length in accordance with a contour size relating to a unit of plural carryings.

According to the second invention, the carrying path can carry the carrying objects with the unit of singular carrying and the unit of plural carrying combined together, and the moving unit moves the carrying object by a moving length according to a contour size relating to a unit of plural carryings, so that the carrying objects can be carried in free carrying modes without a limitation of a unit of carrying, and it is possible to flexibly cope with a change in a production plan or the like to carry the carrying object.

A carrying system of the third invention further comprises a pallet which is carried through the carrying path, and wherein the carrying object is loaded on the pallet and carried through the carrying path, and the pallet has a cover which covers the carrying object to separate an atmosphere in the cover from a surrounding atmosphere.

According to the third invention, the carrying object is loaded on the pallet with the cover and carried, so that a structure and a power usage for ensuring the cleanness of the entire carrying path becomes unnecessary, and the cleanness with respect to the carrying path can be ensured pallet by pallet without any influence of dusts from the carrying path itself.

A carrying system of the fourth invention further comprises a cover body which covers a moving range by the moving unit, and the carrying path.

According to the fourth invention, there is the cover body which covers the moving range by the moving unit, and the carrying path, a range where the carrying object moves is separated from a surrounding atmosphere, thereby maintaining the atmosphere in the cover body clean. To maintain the clean atmosphere, it is preferable that the interior space of the cover body should be depressurized, a predetermined gas, such as a clean air or an inert gas should be supplied in the cover body, combination of performing slight depressurization with supplying a predetermined gas like an inert gas should be carried out, etc.

According to a carrying system of the fifth invention, the carrying path is formed in an annular shape.

According to the fifth invention, because the carrying path is formed in an annular shape, the carrying object in carrying can be circulated, thereby realizing a carrying mode which copes with various layouts where various treating devices are laid out.

According to a carrying system of the sixth invention, an opening is formed in at least one loading region in the loading surface of the loading table, and the carrying system further comprises a closing body which can close the opening.

According to the sixth invention, the opening is formed in at least one loading region, and there is a closing body which closes the opening, so that when the opening is closed, a sealed container like a FOUP can be loaded on the loading surface like a conventional loading table, and when the opening is opened, it is utilized as a path where the carrying object carried through the carrying path is carried through, and the carrying object can be handled freely in a characteristic carrying mode where the region of the loading table and the region of the carrying path are in common.

According to a carrying system of the seventh invention, the closing body is formed in a box-like shape whose bottom face is opened, and the carrying system further comprises a closing body moving unit for moving the closing body within a range from a position where the opening is closed by a top plate of the box-like closing body to a position where the closing body protrudes upward the loading surface.

According to the seventh invention, the closing body is formed in a box-like shape whose bottom face is opened, and is shifted from a state where the top plate of the closing body closes the opening to a state where the top plate protrudes upward the loading surface, so that a container like a FOUP can be loaded on the top plate of the closing body in a closed state when the top plate of the closing body matches with the conventional loading standard for a FOUP or the like, and in a protruding state, a space which allows the carrying object or the like to be temporarily disposed at a transfer position with a device can be ensured, thereby further effectively utilizing the space region of the loading table.

A carrying system of the eighth invention further comprises a storage box which can retain plural carrying objects thereinside, and wherein the closing body can retain the storage box thereinside, and the carrying system further comprises a unit which moves the storage box from a space below the loading surface in such a way that the storage box is retained in the closing body which is so positioned as to protrude upward the loading surface of the loading table.

According to the eight invention, the box-like closing body houses the storage box which temporarily retains the plurality of carrying objects thereinside, and in a state where the closing body protrudes upward the loading surface, the unit for appropriately moving the storage box in the closing body is additionally provided, so that the storage box can be located at an arbitrary position in the vertical direction with respect to the loading surface, and the carrying object can be temporarily located at a stand-by or retract position by utilizing the storage box, the carrying object can be handled in various modes, and a flexible carrying mode can be realized. Moreover, as the storage box is moved upward the loading surface, transfer of the carrying object with a treating device which performs a treatment on the carrying object can be performed in various forms with the storage box being in present therebetween. Note that according to the eighth invention, the storage box is moved single storage box by single storage box, the positioning of the storage box subjected to movement can be accurate, and it is suitable for a case where transfer of the carrying object retained in the storage box is performed by a robot or the like.

A carrying system of the ninth invention further comprises a storage box which can retain plural carrying objects thereinside, and wherein the closing body can retain the storage box thereinside, and the carrying system further comprises a unit which moves the storage box together with movement of the closing body by the closing body moving unit when the storage box is retained in the closing body.

According to the ninth invention, the storage box is retained in the box-like closing body, and the storage box retained in the closing body is moved together with the closing body. Therefore, the carrying object can be temporarily positioned at a stand-by or retract position by utilizing the storage box. When the storage box is moved upwardly, transfer of the carrying object with a treating device which performs a treatment on the carrying object can be carried out freely. Note that in the ninth invention, the closing body one size larger than the storage box is moved together, so that there may be a limitation for using of the closing body and the storage box, but a driving mechanism for moving both ones can be in common, thereby reducing the cost and the space therefor.

A carrying system of the tenth invention further comprises a transport unit which transports a carrying object in such a way that the carrying object moved to that position where no interference occurs by the moving unit is retained in the storage box when the storage box is retained in the closing body which is so positioned as to protrude upward the loading surface of the loading table.

According to the tenth invention, there is the transport unit which transports the carrying object moved to that position where no interference occurs to the storage box moved upwardly, and putting the carrying object in the storage box, so that the carrying object retracted from the carrying path can be smoothly moved in the storage box, transfer of the carrying object between the carrying path and the storage box becomes possible, and it is possible to cope with various carrying situations flexibly.

A carrying system of the eleventh invention further comprises a unit which moves a carrying object moved to that position where no interference occurs by the moving unit to a height of the loading surface of the loading table.

According to the eleventh invention, there is the unit which moves the carrying object moved to that position where no interference occurs to the height of the loading surface of the loading table, the carrying object can be directly moved to the loading surface, and transfer of the carrying object with a treating device which performs a treatment on the carrying object is directly carried out, thereby realizing an effective treatment of the carrying object.

According to the carrying system of the twelfth invention, the moving unit has a unit which moves a carrying object carried through the carrying path obliquely upward a carrying direction.

According to the twelfth invention, the carrying object carried through the carrying path located below the loading surface is moved obliquely upward, the carrying object can be retracted from the retracted from the carrying path without terminating carrying through the carrying path, and, by moving the carrying object along the carrying path, the carrying object can be smoothly moved and stopped with no resistance to an inertia caused by carrying. Note that it is important to gradually decelerate the moved carrying object and stop it from the standpoint of moving the carrying object without causing the carrying object to fall down.

A carrying system of the thirteenth invention further comprises a unit which forms an ascending inclined surface with a portion thereof at a downstream side of a carrying direction being as an upper end so that a carrying object carried through the carrying path travels on, and wherein the moving unit is structured in such a manner as to move the carrying object having traveled on the ascending inclined surface.

According to the thirteenth invention, the ascending inclined surface is formed with respect to the carrying path laid out below the loading surface, the carrying object having an inertia in the carrying direction can travel on the ascending inclined surface. The carrying object having traveled on the ascending inclined surface is moved to that position where no interference occurs, the carrying object in carrying can be moved to a predetermined position without a complex mechanism. Note that it is important that the ascending inclined surface is formed with respect to the carrying path in accordance with arriving of the carrying object to be picked up, has an angle which suppresses the upward acceleration when the carrying object travels thereon so as not to cause the carrying object to be damaged, and has a length and a deceleration mechanism so that the carrying object having traveled thereon can be stopped at a predetermined deceleration.

A carrying system of the fourteenth invention further comprises a unit which moves a carrying object moved to that position where no interference occurs obliquely downward a carrying direction of the carrying path and loading the carrying object on the carrying path.

According to the fourteenth invention, the carrying object located at that position where no interference occurs is moved obliquely downward the carrying direction and loaded on the carrying path, it is possible to return the carrying object to the carrying path without causing an interference with another carrying object carried through the carrying path. It is important that the carrying object is accelerated within a predetermined acceleration which does not cause the carrying object to be damaged while recognizing a vacant portion of the carrying path, and loaded on a vacant portion of the carrying path in synchronization with the carrying speed.

A carrying system of the fifteenth invention further comprises a unit which forms a descending inclined surface with a portion thereof at a downstream side of the carrying direction being as a lower end so that a carrying object located at that position where no interference occurs is slid down to the carrying path.

According to the fifteenth invention, the descending inclined surface having a height according to the carrying surface of the carrying path is formed, and the carrying object moves on the descending inclined surface, so that the carrying object slides down the descending inclined surface and automatically returns to the carrying path. It is important that the descending inclined surface is formed in accordance with arriving of a vacant portion of the carrying path while recognizing the vacant portion so that no interference with another carrying object occurs, has a mechanism which accelerates the carrying object until the speed thereof matches with the carrying speed of the carrying path within a predetermined acceleration which does not cause the carrying object to be damaged, and has an angle which suppresses the upward acceleration when the sliding carrying object travels on the carrying path in such a way that the carrying object is not damaged.

A substrate treating device of the sixteenth invention comprises: a treating unit which performs a treatment on a substrate; a casing which covers the treating unit; and a loading table which is disposed at one side face of the casing, and has a loading surface, and wherein an opening through which a substrate as a predetermined object can pass is formed in said loading surface of said loading table.

According to the sixteenth invention, as the opening through which a substrate as a treatment target can pass is formed in the loading table disposed on one side face of the casing of the treating unit, a transport path for the substrate can be ensured through the opening, and it is possible to cope with various carrying modes.

A substrate treating device of the seventeenth invention further comprises: a carrying path located below the loading surface of the loading table in a space region where a floor occupying portion of the loading table is projected in a vertical direction; and a moving unit which moves one substrate, which is carried through the carrying path and passes through the space region, to a position where the one substrate does not interfere with another substrate.

According to the seventeenth invention, the carrying path is laid out in such a manner as to pass through the space region of the loading table, a space relating to carrying can be reduced, and by moving one substrate so as not to interfere with another substrate, the substrate can be retracted from the carrying path, so that temporal retraction and transporting of the substrate can be performed smoothly to perform a treatment on the substrate to be carried.

According to a carrying method of the eighteenth invention which successively carries carrying objects through a carrying path disposed below a loading surface of a loading table in a space region where a floor occupying portion of said loading table is projected in a vertical direction: one carrying object, which is carried through the carrying path and passes through the space region, is moved to a position where the one carrying object does not interfere with another carrying object; and another carrying object is carried in such a way that another carrying object passes through the space region.

According to the eighteenth invention, one carrying object to be carried is moved to a position where the one carrying object does not interfere with another carrying object, and another carrying object is caused to pass through the space region and carried, an carrying object in carrying can be arbitrary extracted, thereby realizing carrying modes which can cope with various production situations.

According to a carrying method of the nineteenth invention, the carrying path carries carrying objects single carrying object by single carrying object, plural carrying objects by plural carrying objects, or in a combined unit of both carrying units.

According to the nineteenth invention, carrying becomes possible in various carrying units, a carrying mode can be flexibly changed in a production facility where a production amount often changes to do carrying.

BRIEF DESCRIPTION OF DRAWINGS

FIG. 13 Diagrams showing a structure regarding motion of a moving plate in a modified example.

FIG. 15 Diagram showing a wafer retracting mechanism of a modified example.

FIG. 16 Diagram showing a wafer retracting mechanism of another modified example.

FIG. 18 A schematic perspective view showing an example of a conventional carrying system.

EXPLANATION OF REFERENCE NUMERALS

Figure 1:
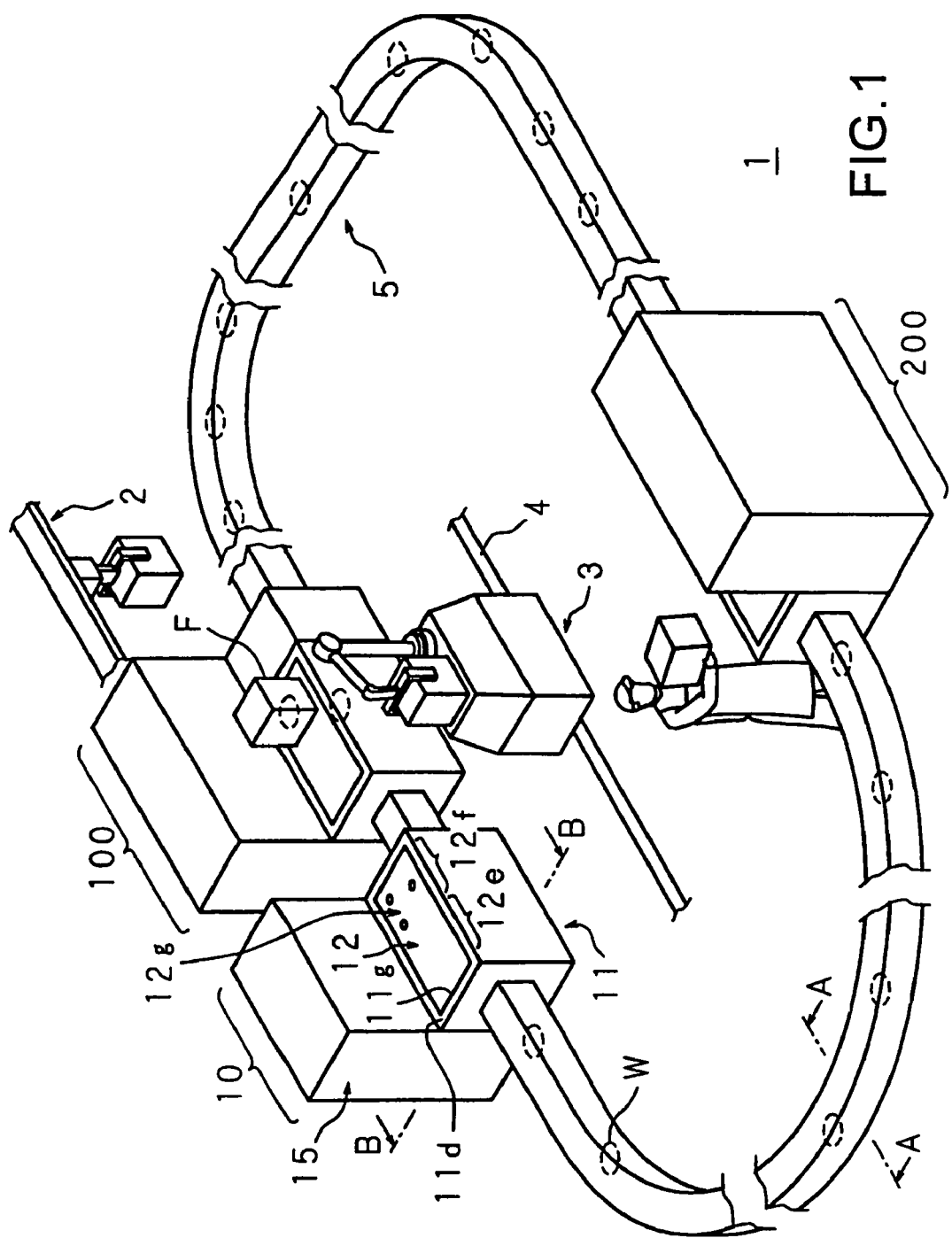
FIG. 1 A perspective view showing a carrying system according to an embodiment of the invention.

1 Carrying system
5 Cover
10, 100, 200 Treating device
11, 111, 150 Loading table
11a Lower room
11b Upper room
11 Loading surface
11g Opening
12, 112 Closing box
12a Top plate
12c Flange
14 Opening/closing device
15 Casing
16 Transfer robot
17 Straight-motion device
18 Vertical-motion device
19 Transport robot
20, 21, 41 Moving plate
22, 23 Guide rail
Bf Buffer
F Sealed container
P Pallet
Pa Protrusive portion
T Carrying path
W Wafer

BEST MODE FOR CARRYING OUT THE INVENTION

FIG. 1 is a perspective view showing a general layout that a carrying system 1 of an embodiment of the invention is applied. The carrying system 1 is for successively carrying wafers (substrates) W, and is constructed in such a manner as to run through treating devices 10, 100, 200, and the like. An existing overhead-type carrying system 2 is present above the carrying system 1. Further, a floor-type carrying system comprising an unmanned carrying device 3 which runs along a guide tape or guide rail 4 loaded on the floor of a manufacturing facility is also present.

Each of the treating device 10, 100, and 200 is for performing a different treatment (treatment relating to manufacturing, treatment relating to measurement, treatment relating to inspection, treatment relating retaining, and the like) on the wafer W, and has the same external basic structure. In explaining the external basic structure with the treating device 10, the treating device 10 has a casing 15 which covers a treating unit that performs a treatment on the wafer W, and is formed in a box-like shape. A loading table 11 on which a sealed container (FOUP or the like corresponds to this) F or the like can put is provided at the front of the casing 15. It is preset that a loading surface 11d of the loading table 11 has a height which enables transfer of the sealed container with the upper overhead-type carrying system 2 and transfer with the unmanned carrying vehicle 3 of the floor-type carrying system. Setting the height of the loading table 11*d* in this manner enhances the affinity and compatibility of the carrying system 1 with the overhead-type carrying system and the floor-type carrying system. Note that a worker S can directly put the sealed container F or the like on the loading surface 11*d* of the loading table 11.

The carrying system 1 has a carrying path which is disposed in such a manner as to run across a space region where the floor occupying portion of the loading table 11 or the like of the treating device 10 or the like is projected in the vertical direction, below the loading table 11*d*, and is covered by a cover 5. Disposing the carrying path in such a manner makes it possible to realize space-saving, and enhance the accessibility to the device 10 or the like from the front. The carrying system 1 comprises the annular carrying path which is covered by the cover 5, the loading table 11 or the like provided next to the casing 15 of the treating device 10 or the like, and the like. The treating unit of each treating device like the treating device 10, the casing 15, the overhead-type carrying system 2 and unmanned carrying vehicle 3 of the floor-type carrying system are not included in the carrying system 1.

Figure 2A:
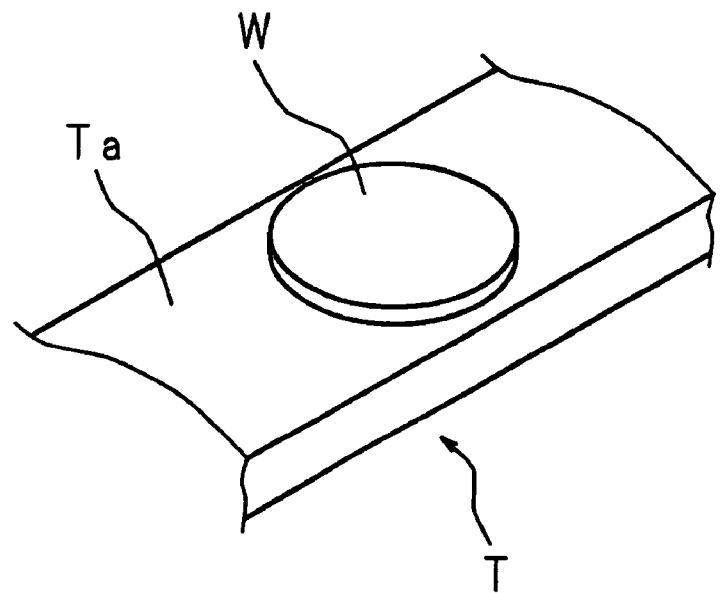
FIG. 2A is a perspective view showing a carrying mode of a wafer alone.
Figure 2B:
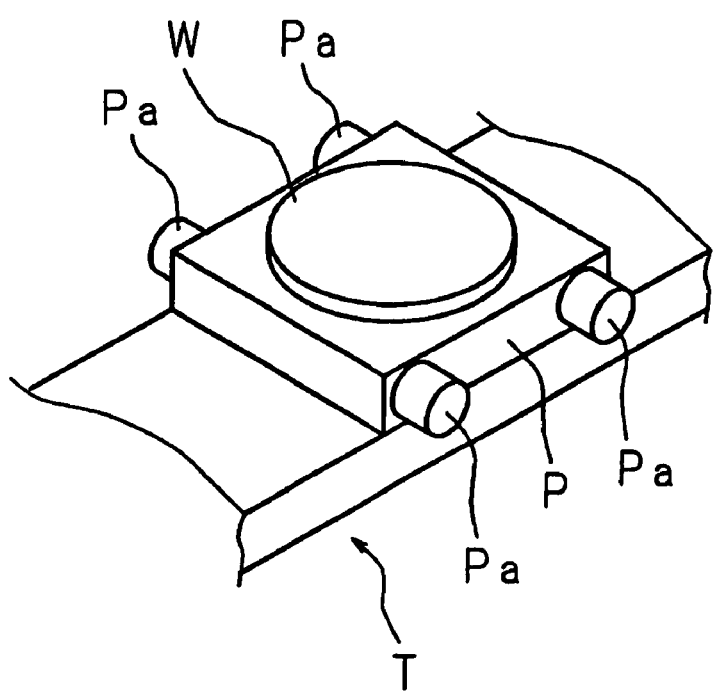
FIG. 2B is a perspective view showing a carrying mode of a wafer mounted on a pallet.

FIGS. 2A and 2B show a carrying mode of the wafer W which can be carried by the carrying system 1, including a carrying path T which extends approximately horizontally in a portion that is covered by the cover 5. FIG. 2A shows a case where the wafer W is directly loaded on a carrying surface Ta of the carrying path T and is carried in a unit of singular carrying, and FIG. 2B shows a case where the wafer W is loaded on a pallet P and carried through the carrying path T in a unit of singular carrying. The pallet P used by the carrying system 1 has a predetermined thickness, and is provided with four protrusive portions Pa each of which protrudes from the lateral side and is formed in a tire-like shape.

Figure 3A:
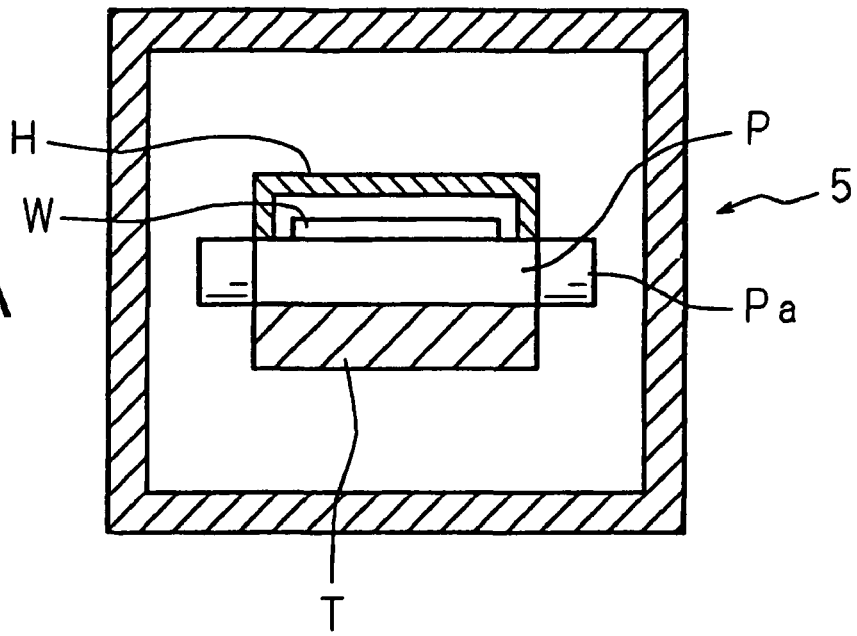
FIG. 3A is a cross-sectional view along a line A-A in FIG. 1.
Figure 3B:
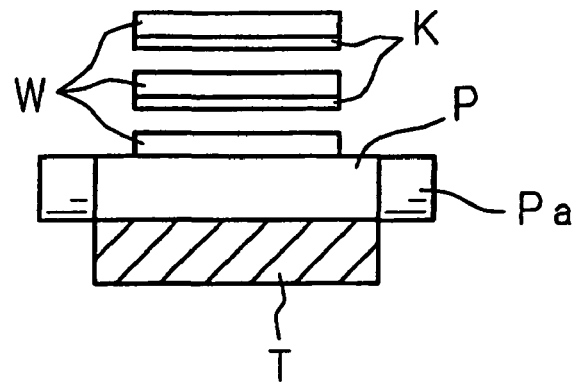
FIG. 3B is a cross-sectional view showing a carrying mode of a plurality of wafers.
Figure 3C:
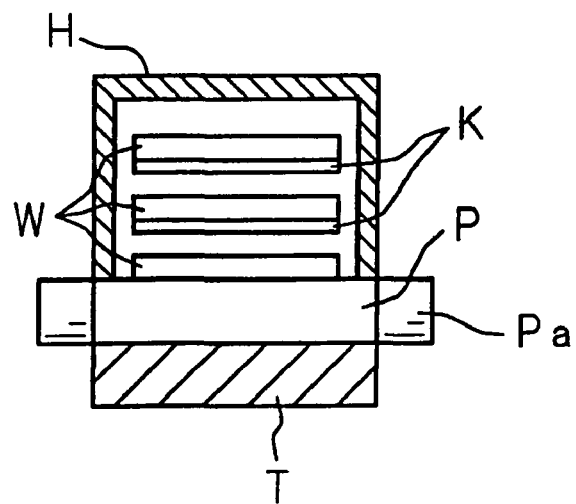
FIG. 3C is a cross-sectional view of a carrying mode where the plurality of wafers are covered by a shielding cover.

FIGS. 3A to 3C show another carrying mode of the wafer W by the carrying system 1. FIG. 3A is a is a diagram along a line A-A in FIG. 1 as viewed from the cut-plane direction to show the positional relationship of the carrying path T in the cover 5. FIG. 3A shows a case where the wafer W loaded on the pallet P is carried by the carrying path T with the wafer shielded by a shielding cover H from the atmosphere therearound in a unit of singular carrying. FIG. 3B shows a carrying mode with a cassette, and shows a case where a plurality of (three) wafers W are loaded on a carrier K formed in a shelf-like shape and provided on the pallet P, and carried through the carrying path T in a unit of plural carryings. Further, FIG. 3C shows a carrying mode with a cassette, and shows a case where a plurality of (three) wafers W are loaded on the carrier K formed in a shelf-like shape and provided on the pallet P, and carried through the carrying path T with the wafers shielded by the shielding cover H from the atmosphere therearound in a unit of plural carryings.

The carrying system 1 can carry the wafer W in any carrying modes shown in FIGS. 2A, 2B, and FIGS. 3A to 3C, and can perform carrying in any one of the carrying modes, in a mode where a single wafer carrying mode and a plural wafers carrying mode are combined, and in a mode where more than or equal to two carrying modes are combined, etc., A carrying mode is decided based on the manufacturing plan of a wafer W, and the wafer W is carried through the carrying system 1 in a required carrying mode by a control device not shown in FIG. 1.

Figure 4:
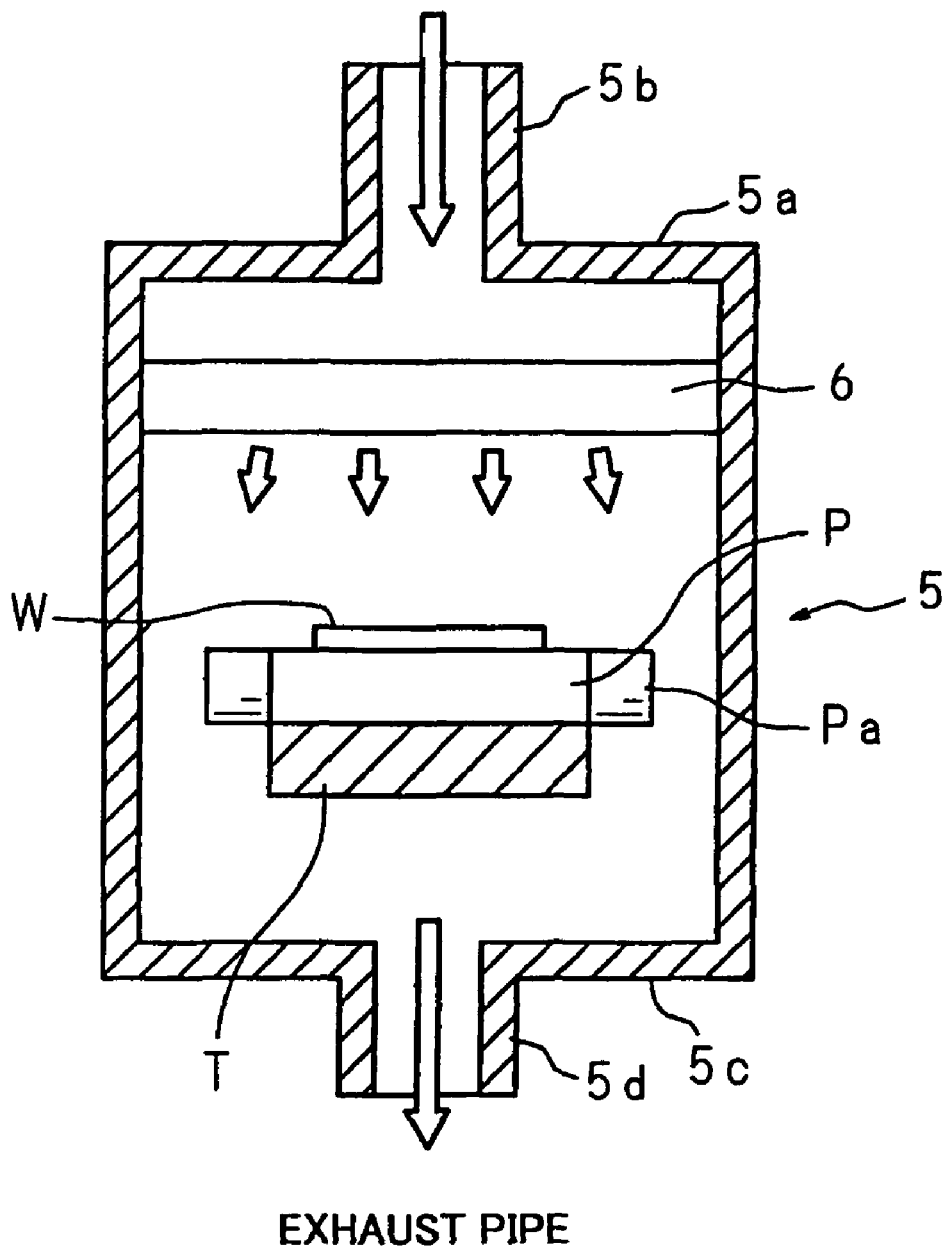
FIG. 4 A schematic cross-sectional view showing the structure of atmosphere separation by pressurizing an inert gas.

FIG. 4 shows the structure of a portion which is provided at a required portion of the cover 5 covering the carrying path T and where an inert gas is supplied. The supply portion of the cover 5 has a supply port 5*b* for the inert gas provided in a top board 5*a*, an exhaust port 5*d* which is connected to a non-illustrated exhaust pipe and provided in a bottom board 5*c*, and a filter provided above the carrying path T. The pressurized inert gas is supplied through the exhaust port 5*d* in the cover 5, filtered by the filter 6, and is evacuated through the exhaust port 5*d*. Supplying such an inert gas causes the interior of the cover 5 to be shielded from the external atmosphere, thereby ensuring a required degree of cleaning. A portion of the carrying path T disposed below the loading table like the loading table 11 of each treating device like the treating device 10 is shielded by a closing box 12, which serves as another cover, from the external atmosphere, and this will be discussed in detail later.

Figure 5A:
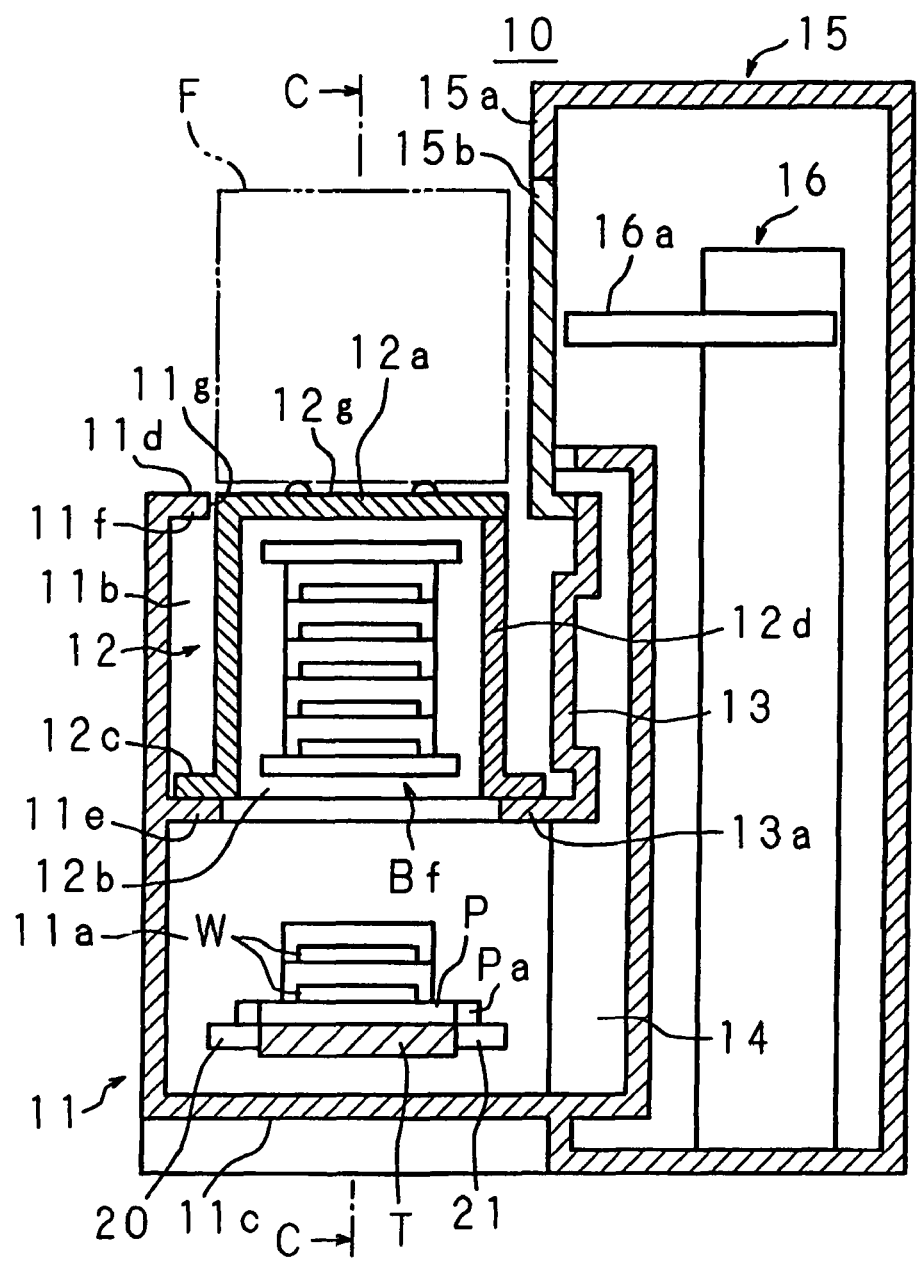
FIG. 5A is a cross-sectional view of a treating device along a line B-B in FIG. 1.
Figure 5B:
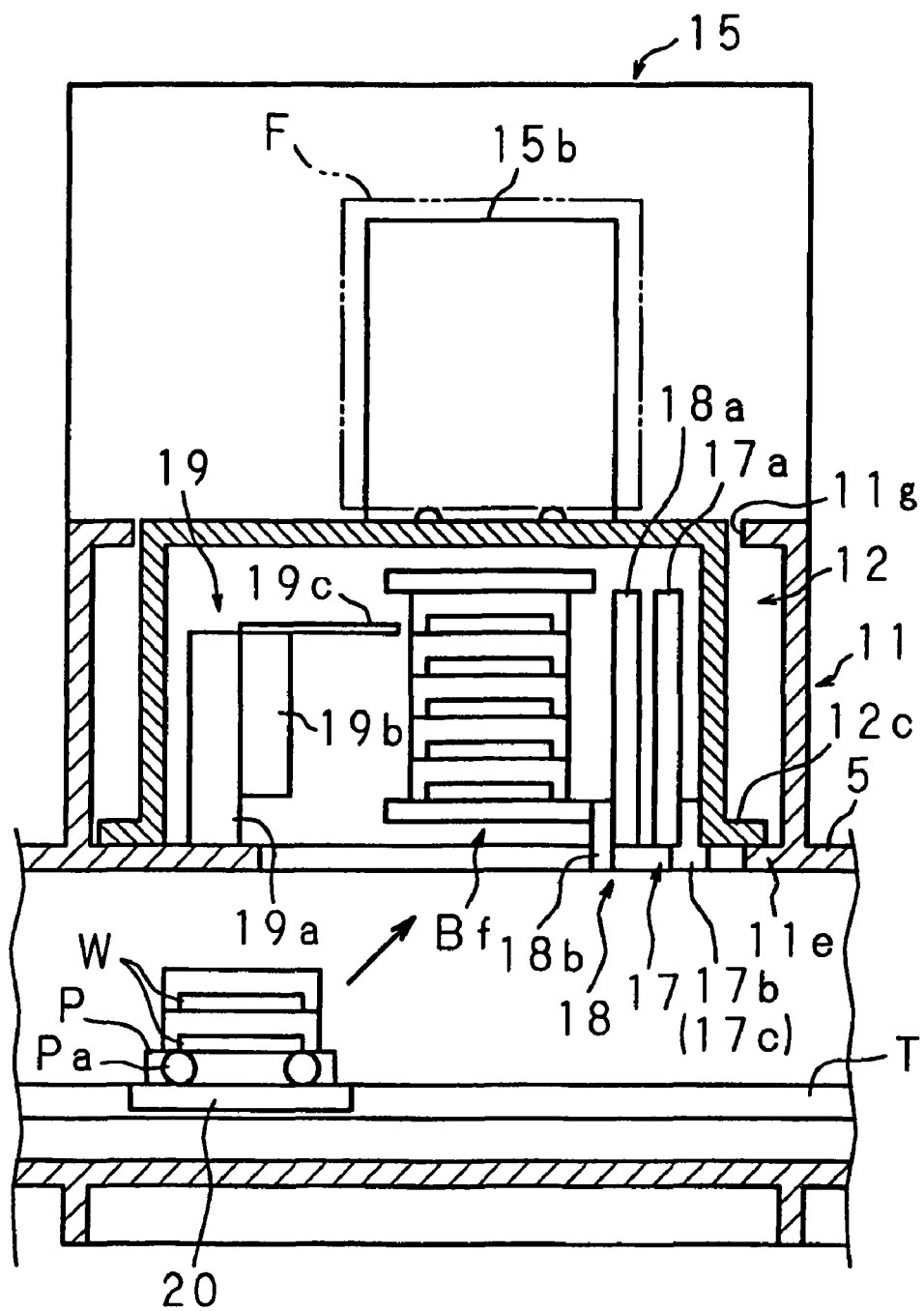
FIG. 5B is a cross-sectional view along a line C-C in FIG. 5A.

FIGS. 5A and 5B show the internal structure of the treating device 10. The treating device 10 has the casing 15 covering the treating unit (not shown) which performs a treatment on the wafer W, and the loading table 11, and is constituted by a portion of the carrying path T which passes through the interior of the loading table 11. The casing 15 has a transfer robot 16 thereinside having an arm 16*a* which accepts the wafer W into the casing, passes the wafer to the treating unit, and feeds the wafer W undergone treatment by the treating unit outwardly.

A door 15*b* is provided at a front face 15*a* of an upper portion of the casing 15, and the door 15 descends to open a part of the front face 15*a* of the casing 15 when the wafer W is accepted into the casing 15. Opening/closing of the door 15*b* is performed by an opening/closing device 14 disposed ahead of the transfer robot 16.

The loading table 11 provided next to the front face 15*a* of the casing 15 is divided into a lower room 11*a* where the carrying path T passes through, and an upper room 11*b* where the closing box 12 which corresponds to a closing body formed in a box-like shape is positioned. The lower room 11*a* corresponds to a space region where a bottom plate 11*c* corresponding to the floor occupying portion of the loading table 11 is projected in the vertical direction, and includes a movable range when the wafer W is scooped from the carrying path T and moved. A portion of the carrying path T which passes through the lower room 11*a* has tabular moving plates 20, 21 provided at both sides of the carrying path T. The moving plates 20, 21 each has an upper surface having the same height as that of the upper surface of the carrying path T, and the protrusive portions Pa of the pallet P are mounted on the moving plates 20, 21 when the pallet P on which the wafer W is put passes through those portions where the moving plates 20, 21 are provided. A structure regarding the motions of the moving plates 20, 21 will be discussed later.

As shown in FIG. 5B, the loading table 11 has a side-wall portion continuous from the cover 5, and has a rib 11*e* protrudingly provided at a portion which divides the loading table into the lower room 11*a* and the upper room 11*b*. A seal member is provided on the upper surface of the rib 11*e*. A side wall 13 at the casing 15 side which constitutes the upper room 11*b* of the loading table 11 is a separate part (see, FIG. 5A), and is moved up and down by the opening/closing device 14. Like the rib 11*e*, the side wall 13 is a provided with a side-wall rib 13*a*. The loading table 11 has a rectangular opening 11*g* formed in the central portion of the loading surface 11*d* which serves as a loading place, and a seal member is provided on the bottom surface of a peripheral circumference 11*f* of the opening 11*g*.

The closing box (called Mini-Environment) 12 positioned in the upper space 11*b* of the loading table 11 has an opened bottom surface so that a size such that a buffer (corresponding to a retaining box) Bf which can retain the plurality of wafers W can be certainly contained in an interior space 12b is secured, and a top plate 12a which serves as a top board has a size such that it can close the opening 11g of the loading table 11. The upper surface of the top plate 12a is constituted by two loading regions 12e, 12f (see, FIG. 1) each of which the sealed container F can be loaded on, and when the top plate 12 closes the opening 11g, the two loading regions 12a, 12f are present on the loading surface 11d of the loading table 11. A kinematic couplings 12g for three-point disposing not on a straight line is provided on one loading region 12f of the top plate 12a to compensate the positional relationship with the sealed container F to be loaded on (to decide a plane). The closing box 12 has a flange 12c provided around the bottom portion thereof in such a manner as to protrude outwardly, and seal members are provided on the upper and bottom surfaces and leading end of the flange 12c. A portion corresponding to the door 15 of the closing box 12 at the casing side 15 is a cover 12d which is a separate part, and is detachable by the opening/closing device 14.

The closing box 12 is movable in the vertical direction and a direction coming close to the casing 15 by a straight-motion device 17 provided in the upper room 11b of the loading table 11. The straight-motion device 17 has a moving unit 17b at a straight-motion guide 17a which extends in the vertical direction through a horizontal-motion guide unit 17c shown in FIG. 6A, and the moving unit 17b is coupled to the bottom portion of the closing box 12. The straight-motion device 17 has a non-illustrated controller which controls the respective motion of the units 17b, 17c, and regarding movement in the vertical direction, the units 17b, 17c are moved up and down along the straight-motion guide 17a.

When the units 17b, 17c are positioned at the lower end side of a movable range controlled by the controller, the closing box 12 has the upper surface of the top plate 12a at the same height as that of the loading surface 11d, the opening 11g of the loading surface 11d is closed by the top plate 12a, and the sealed container F (represented by two-point dashed line in FIGS. 5A and 5B) can be loaded on the upper surface of the top plate 12a. The sealed container F is loaded on by the overhead-type carrying system 2, the unmanned carrying vehicle 3 of the floor-type carrying system, or the worker. When the closing box 12 is positioned at the lower end side of the movable range, the bottom surface of the flange 12c abuts with the respective upper surfaces of the rib 11e and the side-wall rib 13a of the loading table 11, and because the sealing members are provided at the respective abutting portions, the sealing property of the atmosphere in the loading table 11 is maintained by the closing box 12, so that the closing box 12 serves as a cover which covers the movable range of the wafer W.

Figure 6A:
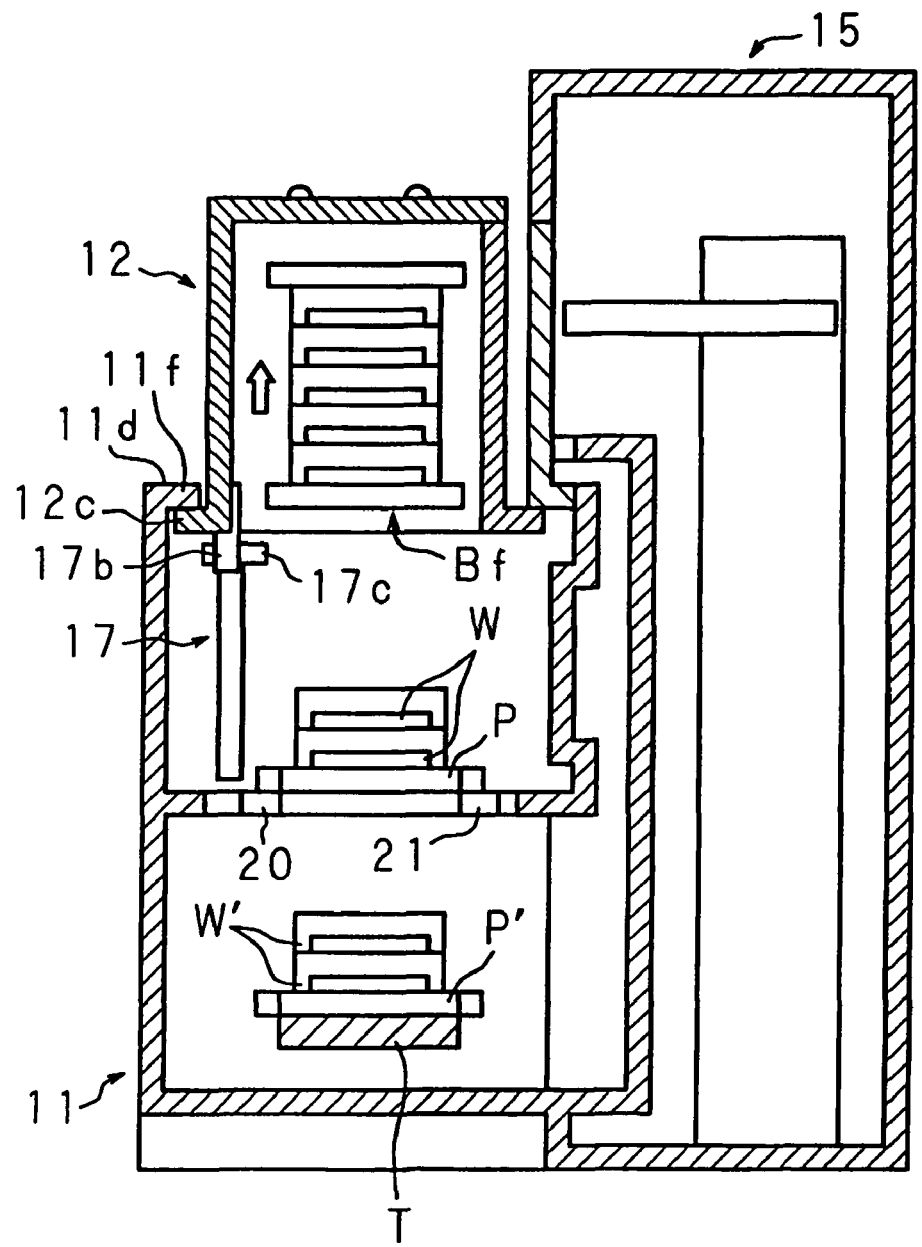
FIGS. 6A and 6B are cross-sectional views showing a state where a closing box and a buffer are lifted.
Figure 6B:
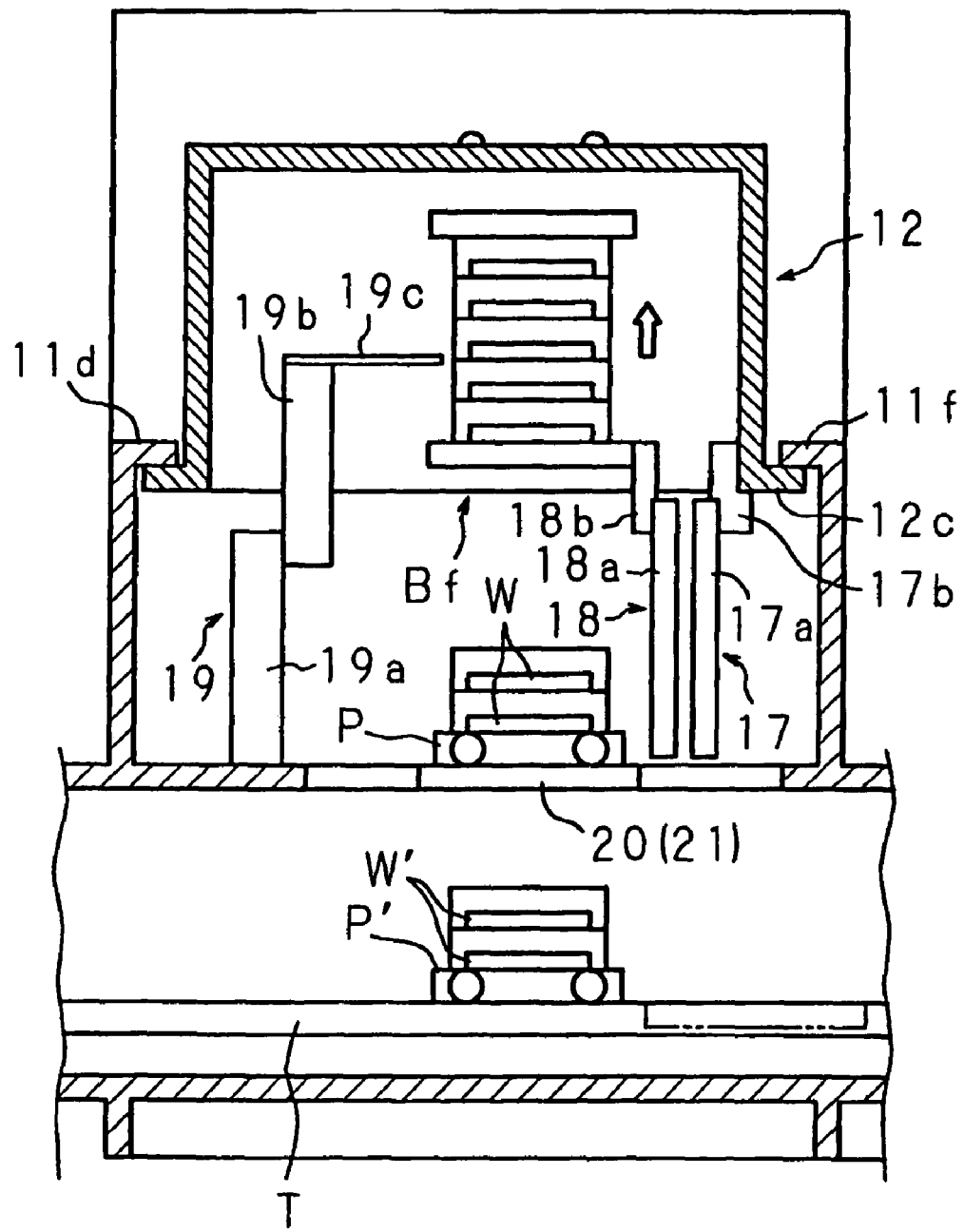

When the units 17b, 17c moves to the upper end side of the movable range, as shown in FIGS. 6A and 6B, the closing box 12 protrudes upward the loading surface 11d of the loading table 11, and the upper surface of the flange 12c of the closing box 12 abuts with the lower surface of the peripheral circumference 11f of the opening 11g. Because the sealing members are also provided at such abutting portions, the sealing property in the loading table 11 can be maintained. Further, when the units 17b, 17c are in motion, the leading end of the flange 12c of the closing box 12 abuts with the inside wall of the upper room 11b, so that the sealing property when those units are in motion can be maintained by the sealing member at the leading end of the flange 12c. In a case where the interior space of the closing box is controlled so as to be a positive pressure state, the interior space of the closing box can be kept clean if a clearance is sufficiently small even if there is no sealing member at the leading end of the flange 12c, and generation of dusts originating from wearing of the seal member can be avoided.

Figure 7A:
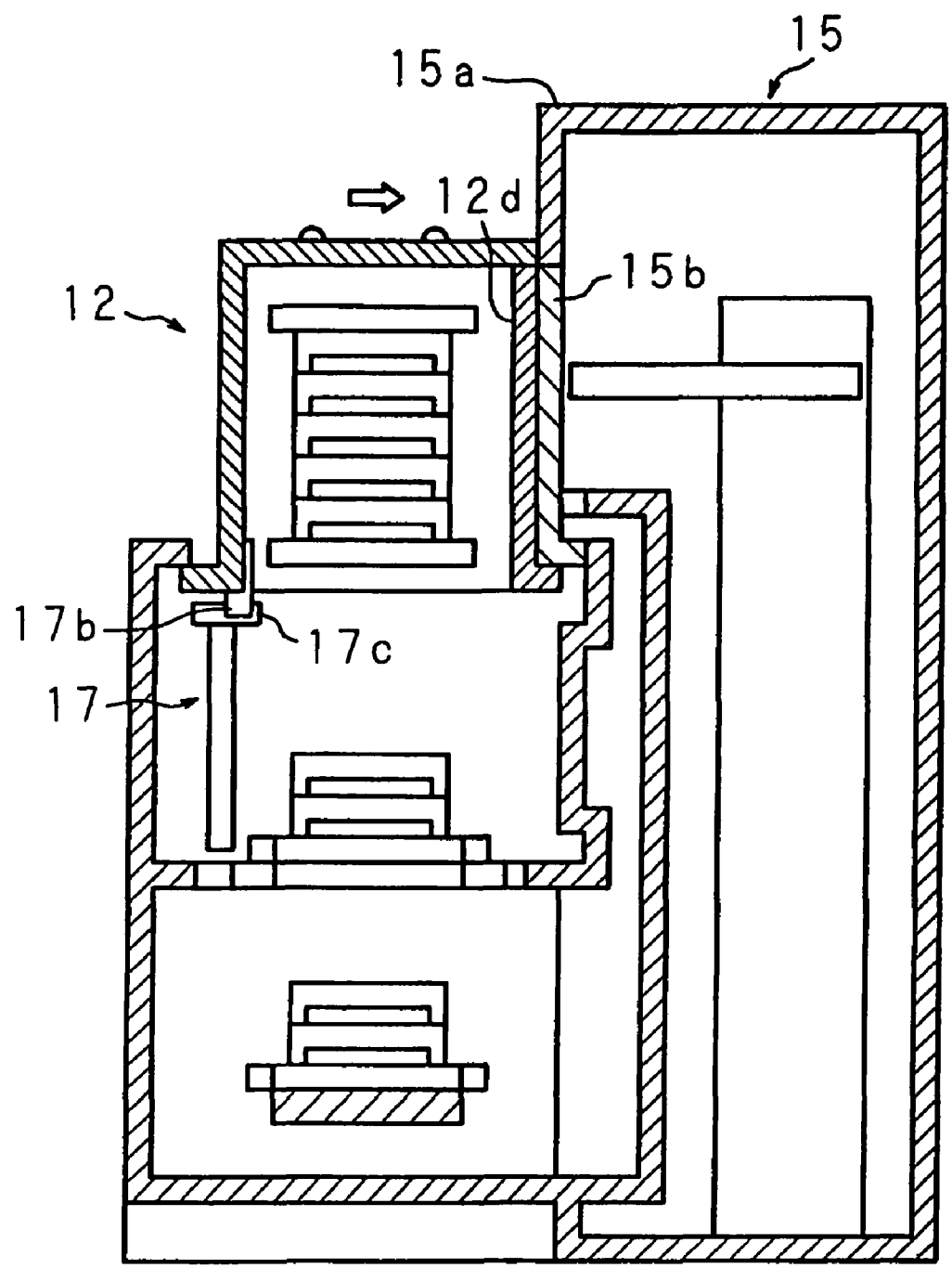
FIG. 7A is a cross-sectional view showing a state where the closing box is moved toward the casing of the treating device.

Further, when the units 17b, 17c are moved to the upper end of the movable range, as shown in FIG. 7A, the closing box 12 is moved so as to closely contact the front face 15a of the casing 15 by moving the moving unit 17b toward the casing 15 with respect to the horizontal-motion guide unit 17c.

Now, return to FIGS. 5A and 5B, the loading table 11 has a vertical-motion device 18 for the buffer Bf provided in the upper room 11b. The vertical-motion device 18 has a non-illustrated controller that controls a moving unit 18b which moves along a vertical guide 18a, and the moving unit 18b is connected to the bottom portion of the buffer Bf, so that the buffer Bf can move up and down in the vertical direction.

Motion of the buffer Bf by the vertical-motion device 18 is controlled in accordance with the moving state of the closing box 12 by the straight-motion device 17, and as shown in FIGS. 5A and 5B, when the closing box 12 is positioned at the lower end side, no control which causes the buffer Bf to move is not performed. On the other hand, as shown in FIGS. 6A and 6B, when the closing box 12 is moved to the upper end side in such a manner as to protrude from the loading surface 11d, the non-illustrated controller recognizes that the closing box 12 is positioned at the upper end side based on the state of the moving unit 17b, and when a required condition is satisfied in this state, the moving unit 18b is caused to move up, and the buffer Bf is moved in such a manner as to be retained in the closing box 12 positioned above the buffer.

Because the wafer W retained in the buffer Bf is to be transferred by the arm 16 of the transfer robot 16, a precise positioning accuracy is required, and the vertical-motion device 18 of the buffer Bf which has a higher positioning accuracy than that of the straight-motion device 17 of the closing box 12 is used.

Figure 7B:
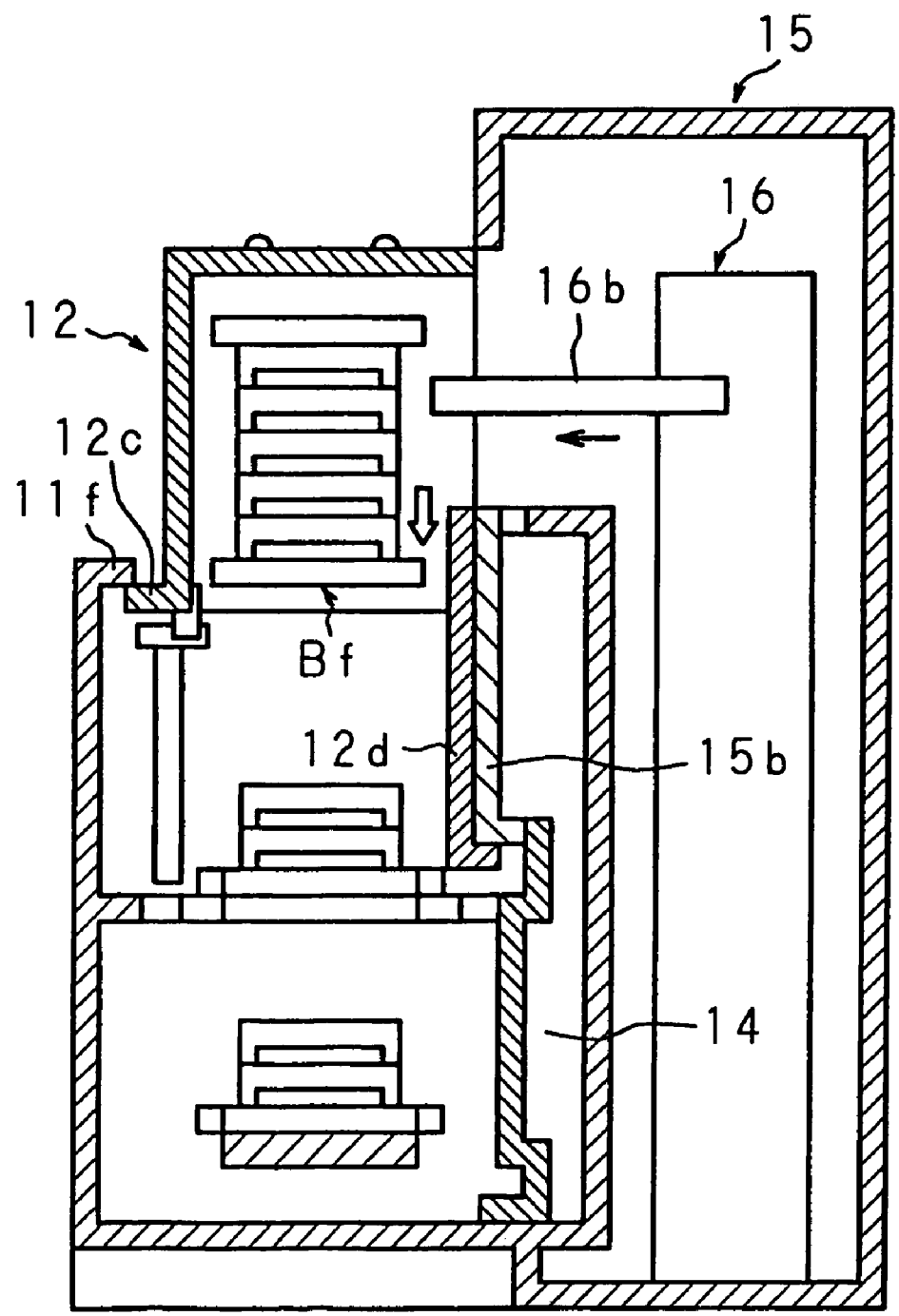
FIG. 7B is a cross-sectional view showing a state where a door and cover are opened.

To transfer the wafer W retained in the lifted buffer Bf by the arm 16 of the transfer robot 16 in the casing 15, as shown in FIG. 7A, first, the closing box 12 is moved to the casing 15 side, and then as shown in FIG. 7B, the door 15b of the casing 15 and the cover 12 of the closing box 12 are descended by the opening/closing device 14. In this state, the arm 16a of the transfer robot 16 extends to the buffer Bf, and transfer of the wafer W is carried out. In this state, the peripheral portion of the cover 12d of the closing box 12 abuts with the front face 15a of the casing 15, and the flange 12c of the closing box 12 abuts with the peripheral circumference 11f, so that the sealing property is maintained.

Figure 8A:
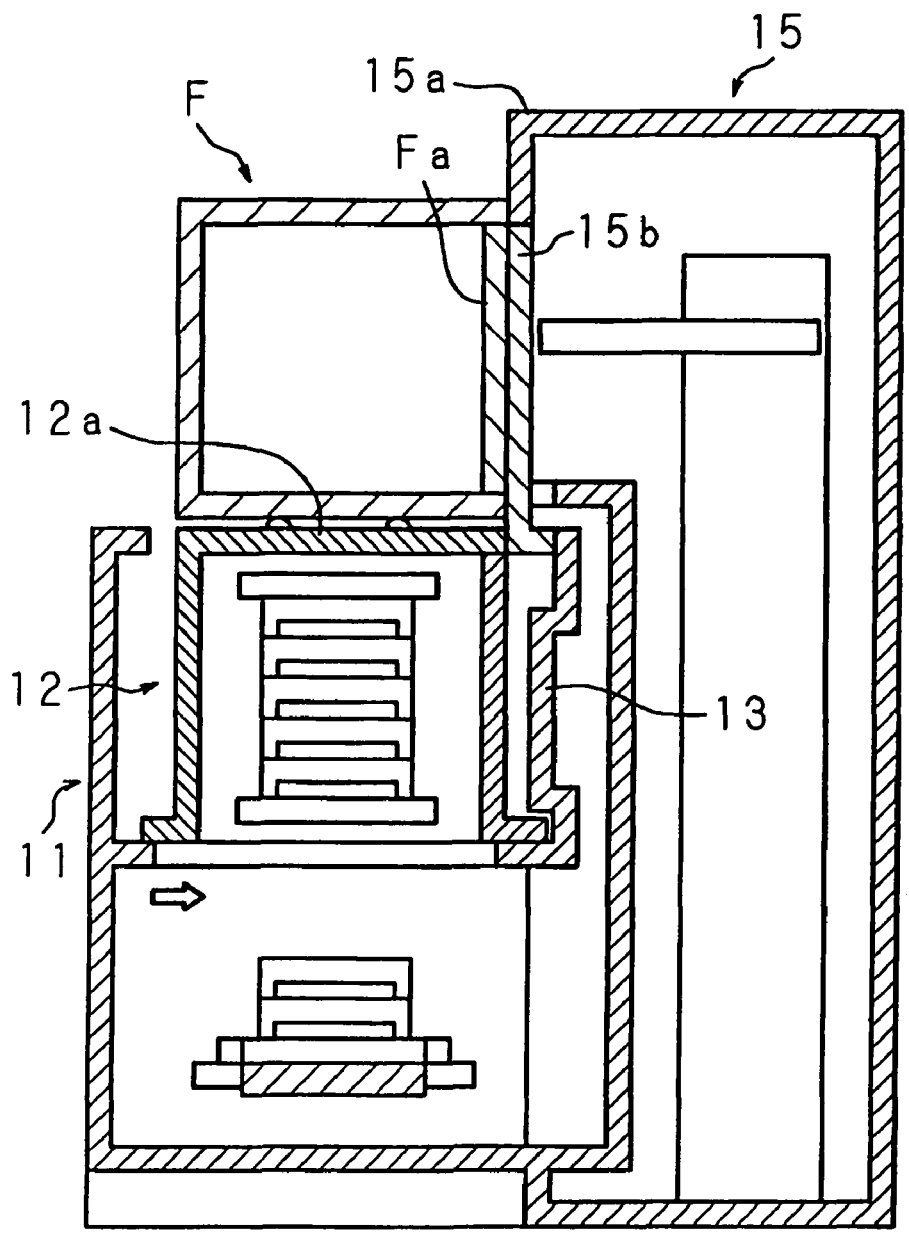
FIG. 8A is a cross-sectional view showing a state where a sealed container is mounted and moved toward the casing of the treating device.
Figure 8B:
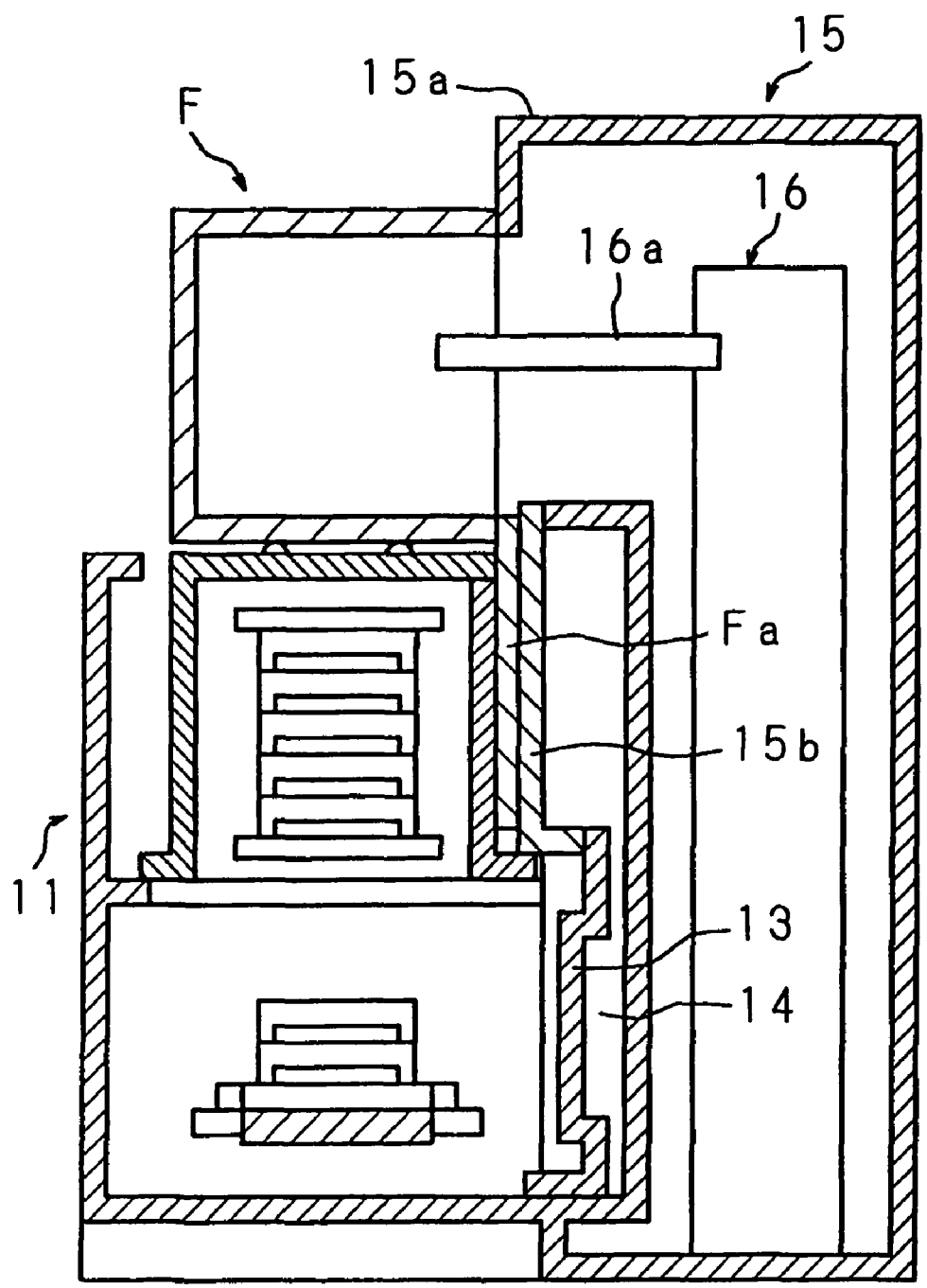
FIG. 8B is a cross-sectional view showing a state where the lid and door of the sealed container are opened.

On the other hand, as shown in FIGS. 5A and 5B, to transfer the wafer W to the sealed container F loaded on the top plate 12a of the closing box 12 positioned at the lower side, the same is basically true like the foregoing case. To be more precise, as shown in FIGS. 8A and 8B, the sealed container F has a surface which faces the casing 15 and servers as an openable/closable lid Fa, the lid Fa closely contacts the door 15b of the casing 15 when the closing box 12 is moved toward the casing 15, and in this state, the opening/closing device 14 causes the lid Fa, the door 15b, and the side wall 13 of the loading table 11 to descend. Accordingly, the sealed container F is opened, the arm 16a of the transfer robot 16 extends inside the sealed container F, and transfer of the wafer W is carried out. At this time, the end surface of the sealed container F contacts the casing 15a, the airtightness is maintained.

Return to FIGS. 5A and 5B again, in the upper room 11b of the loading table 11, a transport robot 19 for transporting the wafer W is also disposed. The transport robot 19 comprises a moving unit 19b which moves vertically with respect to a base unit 19a, and an arm unit 19c provided at the upper end of the moving unit 19b, and a non-illustrated robot controller controls transportation by the transport robot 19.

Transportation of the wafer W by the transport robot 19 is carried out with respect to the buffer Bf at an ascending position as shown in FIG. 6B, and the wafer W moved by the moving plates 20, 21 to a position where a following wafer W'does not interfere with the wafer W from the carrying path T and loaded on the pallet P is subjected to transportation. When it is detected that the buffer Bf and the wafer W are in a positional relationship shown in FIG. 6B, the non-illustrated robot controller causes the transport robot 19 to transport the wafer W to an unoccupied shelf of the buffer Bf if a required condition is satisfied.

Further, the robot controller can cause the transport robot 19 to transport the wafer W retained in the buffer Bf to the pallet P in such a way that the wafer is loaded on the pallet. Such transportation by transport robot 19 makes it possible to feed the wafer W carried through the carrying path T to the treating unit in the casing 15 of the treating device 10 to perform a required treatment thereon, and to return the wafer W undergone treatment to the pallet P.

Figure 9A:
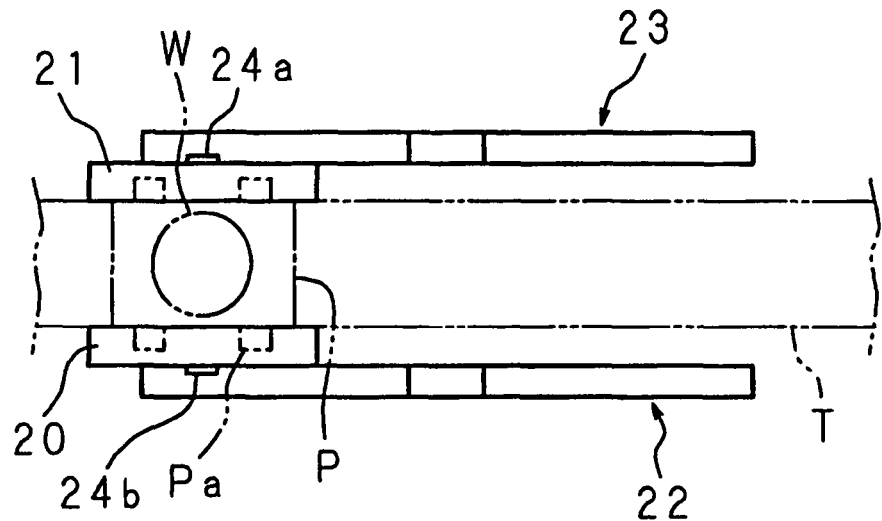
FIG. 9A is a top plan view showing a carrying path of that portion where moving plates are provided.

FIG. 9A is a top plan view showing those portions of the carrying path T where the moving plates 20, 21 are provided. Guide rails 22, 23 are disposed outward the moving plates 20, 21, and the moving plates 20, 21 are coupled to the guide rails 22, 23, respectively, through intervening moving units 24a, 24b. The guide rails 22, 23 are omitted in FIGS. 5A and 5B to FIGS. 8A and 8B to simplify the figures, but are provided in the loading table 11. The guide rail may be replaced by a robot-arm which has the same trajectory as that of the guide rail. The trajectory is not limited to limited to a straight line, and a curve which can reduces an acceleration in the vertical direction in running on from a carrying device.

Figure 9B:
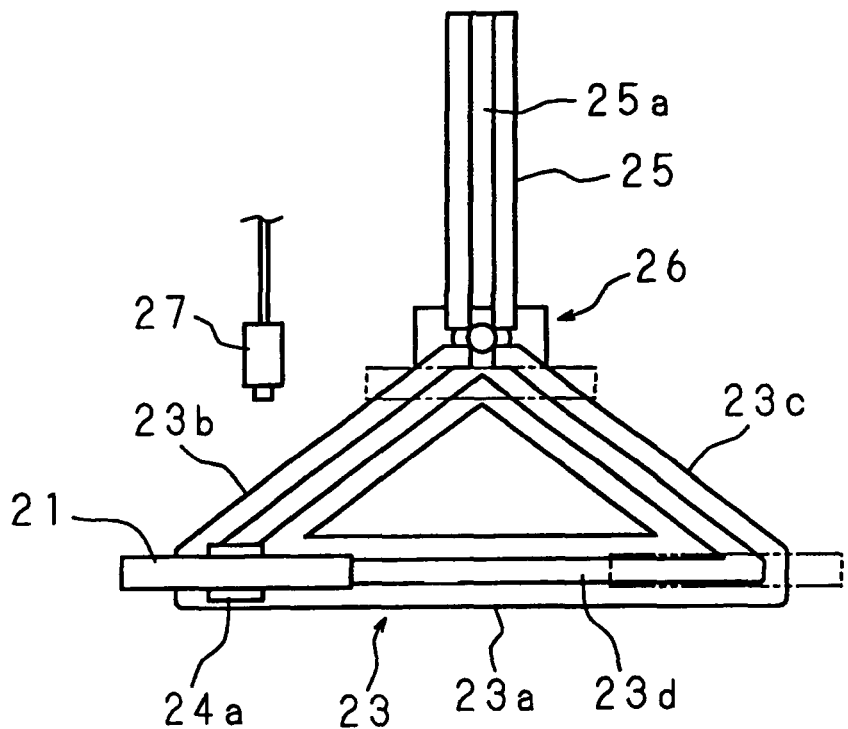
FIG. 9B is a top plan view showing a structure regarding motion of one moving plate.

FIG. 9B is a schematic view showing the shape of the guide rail 23 of the moving plate 21, and because the guide rail 22 of the other moving plate 20 has the symmetrical shape, an explanation will be given of the one guide rail 23 only. The guide rail 23 is formed in a triangle shape entirely, comprises a bottom side portion 23a corresponding to the bottom side, a left oblique side portion 23b corresponding to the left oblique side, and a right oblique side 23c corresponding to right oblique side, and a guide groove 23d is so formed as to be continuous from the individual side portions 23a to 23c. It is set that the size in the vertical direction from the center of the bottom side portion 23a to a vertex portion where both oblique side portions 23b, 23c intersect is larger than a size in height in a carrying mode where the plurality of wafers W are covered by the shielding cover H shown in FIG. 3C.

The intervening moving unit 24a is fitted into the guide groove 23d, and the intervening moving unit 24a changes the direction thereof at the ends of the respective side portions 23a to 23c, and moves along the guide groove 23d clockwise in FIG. 9B. Movement of the intervening moving unit 24a is also controlled by a non-illustrated controller, and the controller performs movement control by a sensor 27 which detects the position of the leading end of the pallet P passing through the moving plate 21 when the intervening moving unit 24a is positioned at the left end of the bottom side portion 23a.

That is, when the sensor 27 detects the pallet P with a predetermined condition satisfied, the foregoing controller causes the intervening moving unit 24a of the moving plate 21 to move from a position represented by solid lines in FIG. 9B to the vertex of both oblique side portions 23b, 23c (represented by two-pointed dashed lines in the figure). The intervening moving portion moves obliquely upward along the carrying direction of the carrying path T, and the vertex where the intervening moving unit has moved corresponds to a position where the following wafer W does not interfere. In moving, first, the intervening moving unit starts moving at the same speed as the carrying speed of the carrying path T, but gradually slows down, and the intervening moving unit 34a is softly stopped at the vertex of both oblique side portions 23b, 23c.

By performing such movement control, the wafer W which is carried through the carrying path T, passes through the lower room 11a of the loading table 11, and shown in FIG. 5B is smoothly moved to a position where the wafer W' loaded on the following pallet P' shown in FIG. 6B does not interfere. Thus, the structure shown in FIGS. 9A and 9B functions as moving means of the wafer W.

Figure 10A:
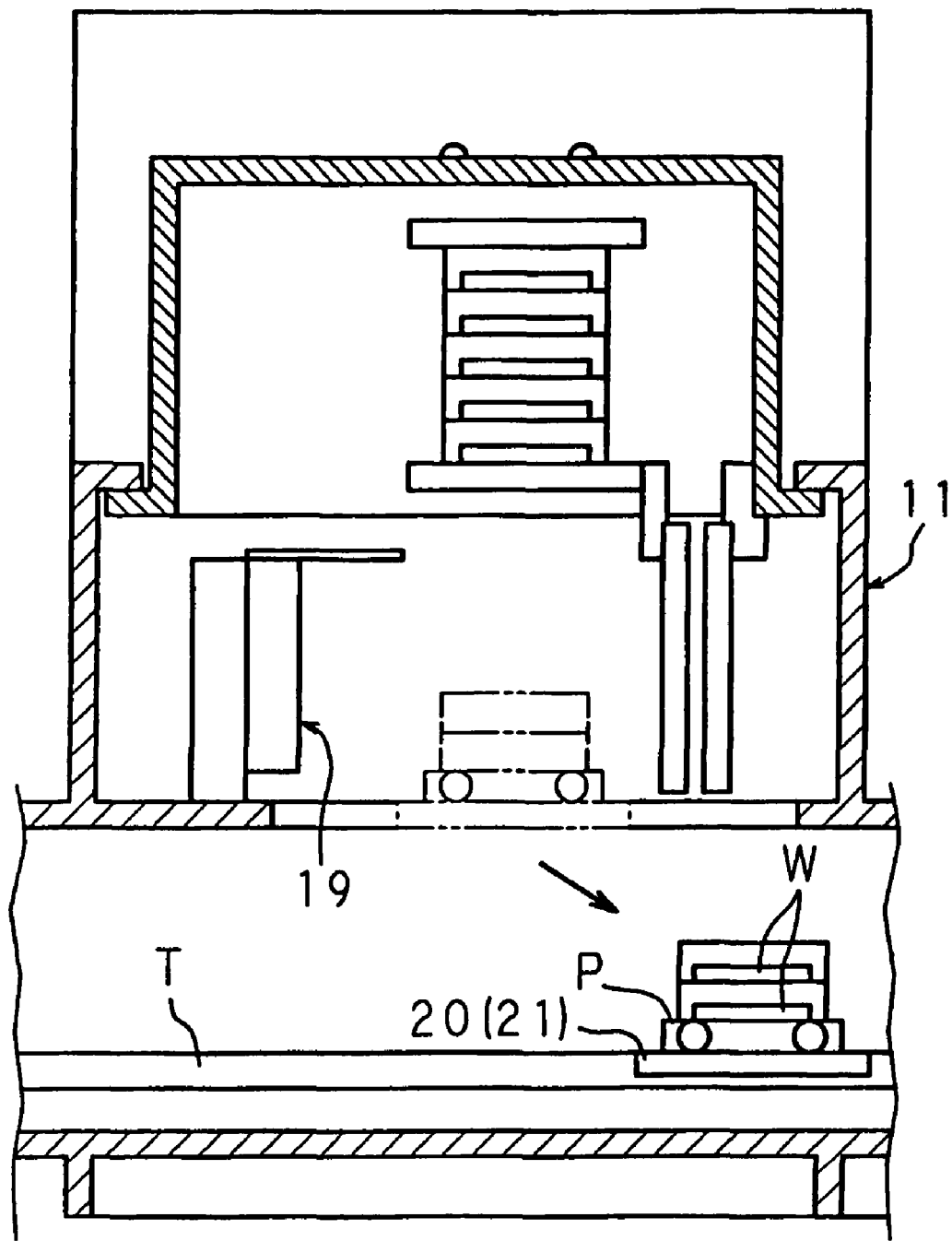
FIG. 10A is a cross-sectional view showing a state where a wafer is returned to a carrying path by a moving plate.

Return to FIG. 9B, when a required condition is satisfied, the foregoing controller performs control in such a way that the intervening moving unit 24a positioned at the vertex of both oblique side portions 23b, 23c is moved to the right end of the bottom side portion 23a. In this movement, a speed is controlled such that the unoccupied position of the carrying path is detected beforehand by a non-illustrated sensor, the intervening moving unit is gradually accelerated, and reaches the unoccupied position of the carrying path T at the same speed as the carrying speed of the carrying path T when the intervening moving unit reaches the right end of the bottom side portion 23a. By performing such control, as shown in FIG. 10A, the wafer W positioned at a position where no interference occur is moved obliquely downward along the carrying direction of the carrying path T, loaded on the unoccupied position of the carrying path T, and returned to the state subjected to carrying by the carrying path T. When the wafer W is returned to the carrying path T, the intervening moving unit 24a moves along the bottom side portion 23a, and the moving plate 21 is returned to the original position.

Return to FIG. 9B again, a perpendicular rail 25 is joined to the vertex of the guide rail 23 through a change-over unit 26. The perpendicular rail 25 also has a guide groove 25a, and the perpendicular rail 25 has a size which allows the wafer W loaded on the pallet P to reach the descending point of the transport robot 19 when the buffer Bf is present as shown in FIG. 10A, and the wafer to reach the height of the loading surface 11d of the loading table 11 when the buffer Bf is removed as shown in FIG. 10B.

The change-over unit 26 positioned between the perpendicular rail 25 and the guide rail 23 is for changing over releasing/closing of the guide grooves 23d, 25a, and when the intervening moving unit 24a is moved along the guide rail 23, the lower end of the guide groove 25a of the perpendicular rail 25 is closed. When the intervening moving unit 24a is guided to the perpendicular rail 25, the guide groove 23d at the upper end of the right oblique side portion 23c is closed. Such changing-over is also controlled by the foregoing controller. After it is determined that the closing box 12 protrudes from the loading surface 11d and the buffer Bf is moved up in the closing box if there is the buffer Bf, the controller performs controls relating to change-over to the perpendicular rail 25 and movement of the intervening moving portion.

Figure 10B:
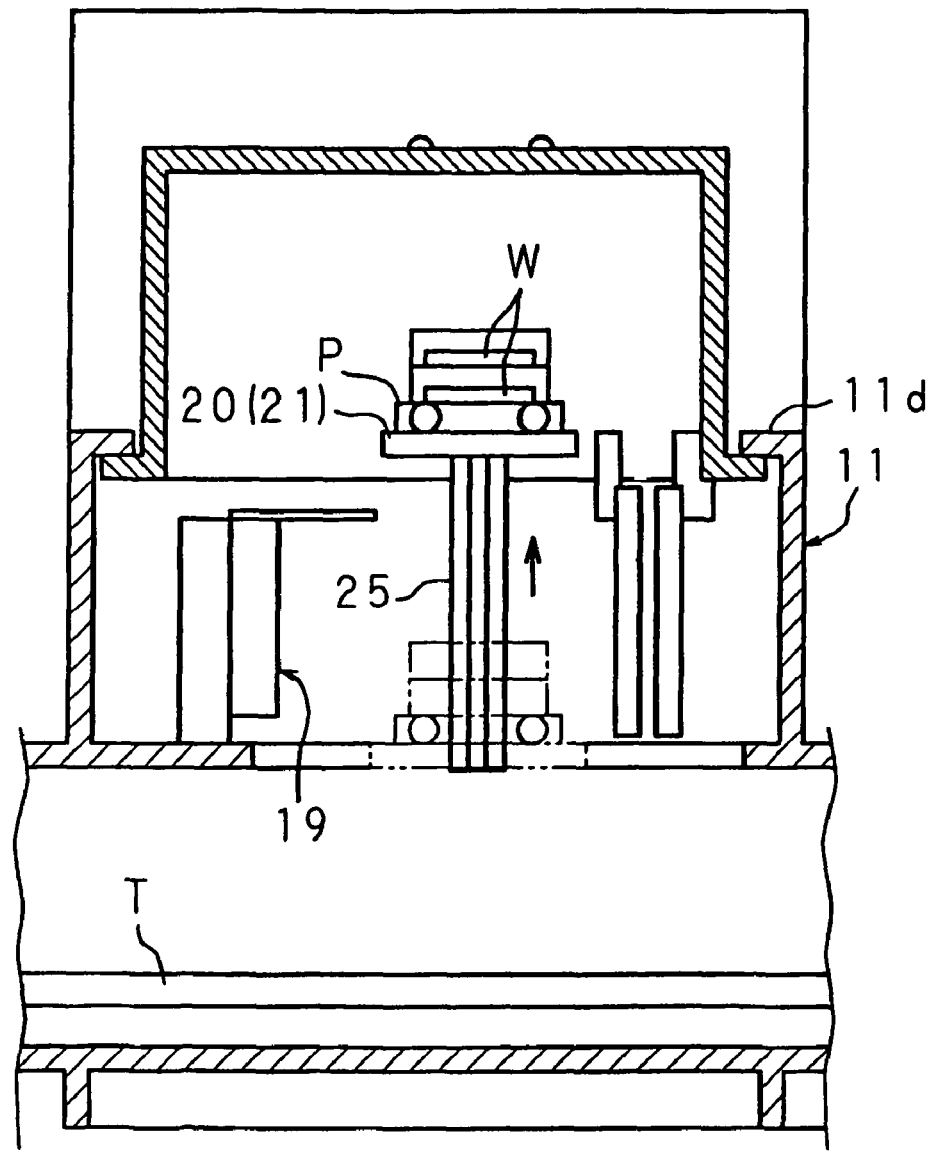
FIG. 10B is a cross-sectional view showing a state where a wafer is lifted to the height of a mounting surface.

By performing controls relating to change-over to the perpendicular rail 25 and movement of the intervening moving portion, as shown in FIG. 10B, the wafer W loaded on the pallet P can move to the height of the loading surface 11d of the loading table 11 directly from the carrying path T, so that it becomes possible to extract the wafer W from the carrying path T and return the wafer to the carrying path at random. The wafer W moved to the height of the loading surface 11d is transferred in the casing 15 based on movement of the closing box 12 and descending of the door 15 and the cover 12d shown in FIGS. 7 and 7B.

In the case of a carrying mode where the pallet P shown in FIG. 2A is not used, non-illustrated hands which directly pick up a wafer from the carrying path are caused to extend from the moving plates 20, 21 to directly pick up a wafer, and then the similar operations to the foregoing operations will be performed.

Figure 11:
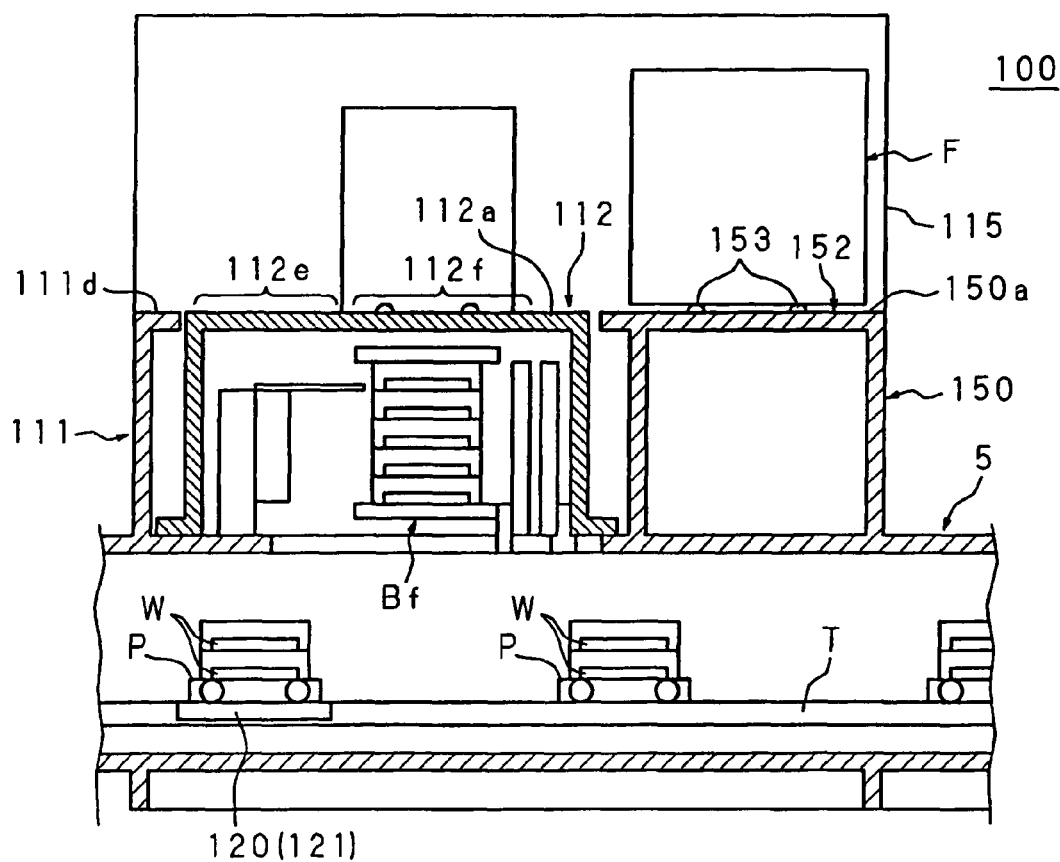
FIG. 11 A cross-sectional view of a treating device provided with a plurality of loading tables.

The treating device 10 has one loading table 11 provided next to the casing 15, but a plurality of loading tables may be provided depending on a treatment to be performed on the wafer W. FIG. 11 shows the structure of the treating device 100 having two loading tables 111, 150 provided in a line next to a casing 115. Because the treating device 100 has two loading tables 111, 150 provided in a line at the front face thereof, it has a size with respect to the carrying direction of the carrying path T longer than that of the treating device 10 shown in FIG. 5B and the like.

One loading table 111 of the treating device 100 has the same structure as that of the loading table 11 of the treating device 10, provided in such a way that a closing box 112 can be movable with respect to a loading surface 111d in the loading table 111, and the buffer Bf is retained thereinside in a movable manner, and the wafer W passes through the interior space of the loading table 111 can be moved upwardly by moving plates 120, 121. The closing box 112 has two loading regions 112e, 112f in a top plate 112a. The other loading table 150 basically has the same structure as that of a conventional load port, has one loading region 152 with kinematic couplings 153 formed in a closed loading surface 150a having no opening, and the carrying path T covered by the cover 5 runs across a space below the loading surface 150a of the loading table 150.

In the treating device 100, transfer of the wafer W to the carrying path T is carried out through the one loading table 111, and the other loading table 150 is used for putting on the sealed container F from its surroundings, and this makes it possible to effectively use the loading table 150 structured based on the conventional load port, have a plurality of places on which the sealed container F can put for the other carrying systems, such as the overhead-type carrying system 2 and the floor-type carrying system, thus improving the affinity and the compatibility with respect to the other carrying systems. Note that a transfer robot which can transfer the wafer W to both one loading table 111 and sealed container F loaded on the other loading table 150 is provided in the casing 115 of the treating device 100.

According to the carrying system 1 of the embodiment, the displacement configuration of the loading table 11, 111, 150 is not limited to one shown in FIG. 5B, FIG. 11, and the like, the required number thereof may be changed in accordance with the treatment that the treating device 10, 100, 200 or the like performs, and for example, the plurality of loading tables 11 shown in FIG. 5B may be arranged, and the plurality of loading tables 11 and the plurality of loading tables 150 shown in FIG. 11 may be disposed.

Using such a carrying system 1 realizes a carrying method that the wafer W passing through the interior space of the loading table 11, 111 is moved to that position where the following wafer W' does not interfere, and during this movement, the following wafer W' is caused to pass through the interior space of the loading table 11, 111 and carried, and the wafer W. W' can be carried in a unit of singular carrying, a unit of plural carryings, or in a combination unit of both units.

The carrying system 1 of the embodiment is not limited to the foregoing embodiment, and can be modified in various forms. For example, the shape of the carrying path T is not limited to the annular shape shown in FIG. 1, and may be various shapes, such as a shape diverged from the annular shape, and a shape like a fishbone. An object to be carried is not limited to the wafer W, other kinds of works can be definitely carried, and in particular, application to a tabular work is appropriate.

According to the carrying system 1, the closing box 12 and the buffer Bf may not be moved separately, but the closing box 12 and the buffer Bf retained therein may be moved together as shown in FIGS. 5A and 5B, and FIGS. 6A and 6B. In this case, a structure such that the buffer Bf is attached to the straight-motion device 17, the buffer Bf is moved by merely the straight-motion device 17, and the vertical-motion device 18 is omitted is employed.

Further, when the loading table 11 shown in FIG. 5B does not need to retain the buffer Bf thereinside, a structure such that the vertical-motion device 18 relating to motion of the buffer Bf from the loading table 11 and the transport robot 19 which transport the wafer W are omitted may be employed, and the loading table 11 structured in such a manner can have a reduced size to the carrying direction which is the same size as that of the loading table 150 shown in FIG. 11 by elimination of the transport robot 19.

Figure 12:
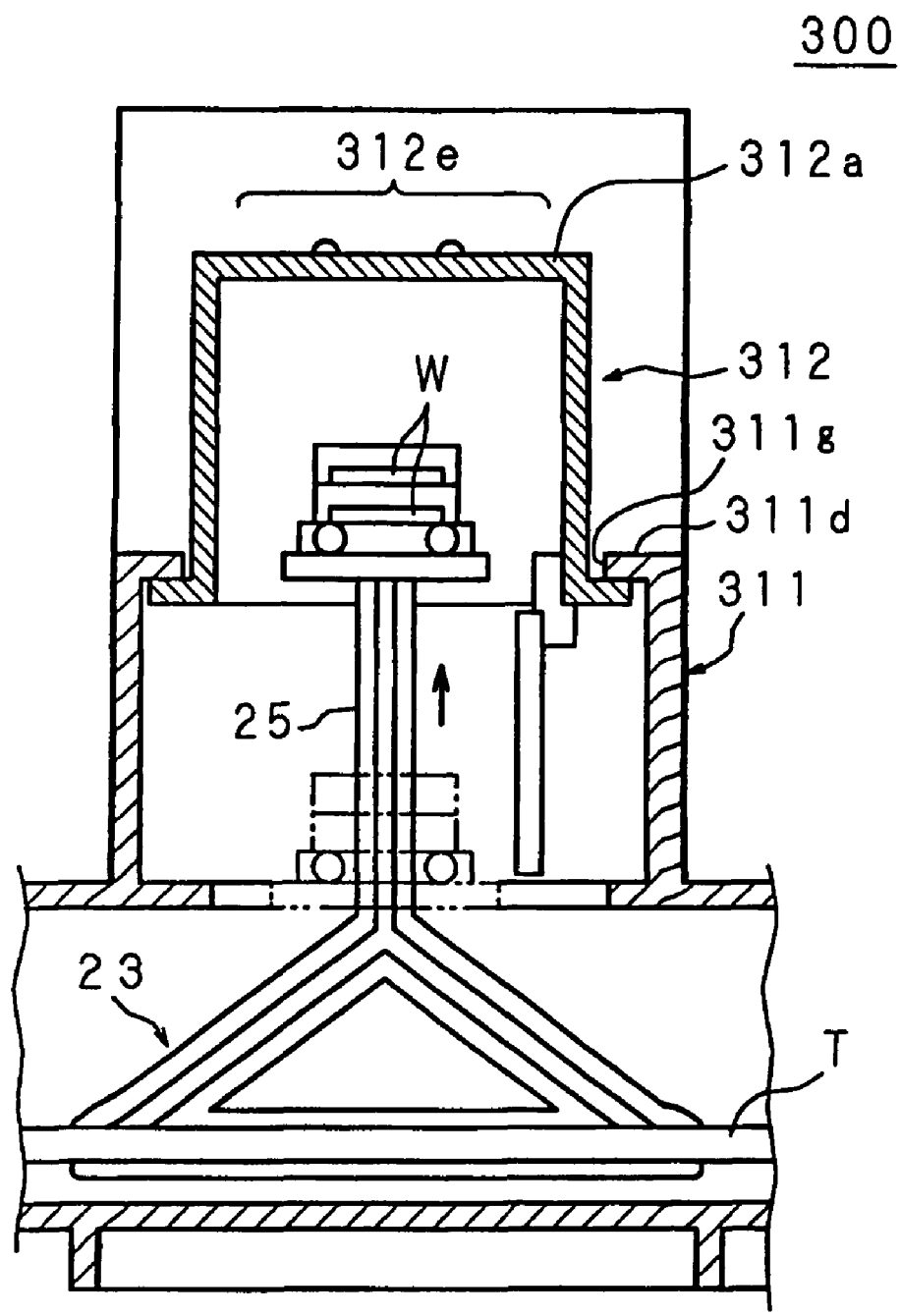
FIG. 12 A cross-sectional view of a treating device provided with a loading table having one mounting area.

FIG. 12 shows a small-size treating device 300 where the buffer Bf and the transport robot are omitted, and the treating device has a loading table 311 having an opening 311g which is formed in a loading surface 311d and closed by a closing box 312 having one loading region 312e in atop plate 312a. One sealed container F can be loaded on the loading table 311, the buffer is not provided therein, and the wafer W is moved to the height of the loading surface 311d in the vertical direction by providing a mechanism regarding the guide rail 23 shown in FIG. 9B and the vertical rail 25.

In the embodiment shown in FIGS. 5 to 8, when it is not necessary to put the sealed container F like an FOUP on the top plate 12a of the closing box 12, the closing box 12 or both of the closing box 12 and the buffer Bf may be fixed at the ascending position, and the straight-motion device 17 and the vertical-motion device 18 may be omitted appropriately. In this case, the closing box 12 may be integral with the casing 15 of the treating device 10, and employing such a structure makes it possible to omit a driving mechanism (structure regarding the horizontal-motion guide unit 17c) which presses the closing box 12 against the casing 15, too. Further, when it is not necessary to separate the interior atmosphere of the closing box 12 and the interior atmosphere of the casing 15 from each other, the opening/closing mechanism of the door 15b can be omitted.

Figure 13A:
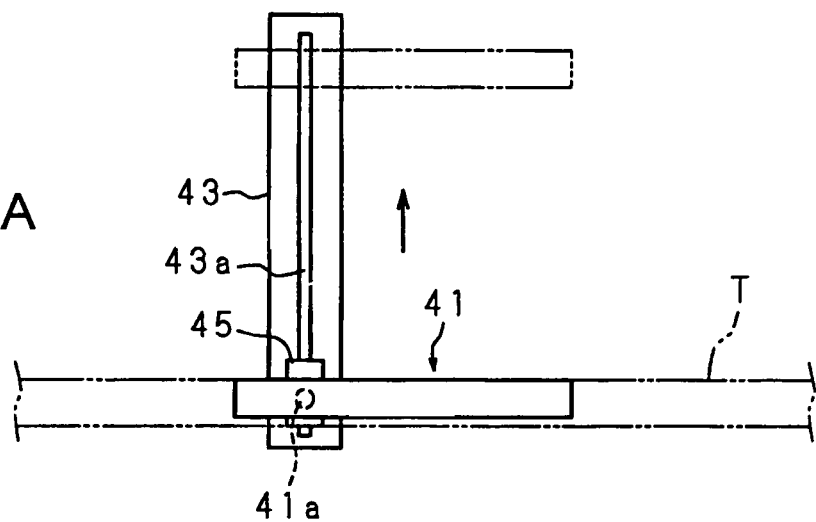
FIG. 13A is a top plan view showing a state before movement.
Figure 13B:
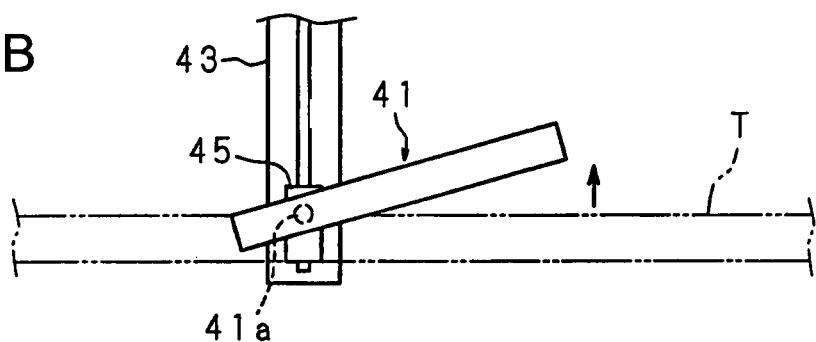
FIG. 13B is a top plan view showing a state where a moving plate is rotated to form an ascending inclined surface.
Figure 13C:
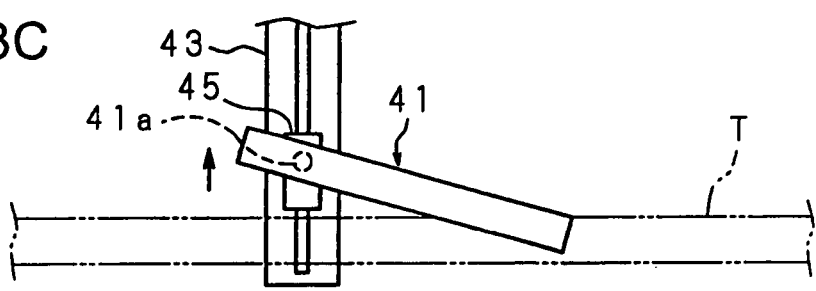
FIG. 13C is a top plan view showing a state where the moving plate is rotated and moved to form a descending inclined surface.

As the structure of moving means which moves the wafer W carried by the carrying path T to that position where the following wafer W does not interfere, not only the structure shown in FIGS. 9A and 9B, but also a structure shown in FIGS. 13A to 13C can be employed. A moving plate 41 in FIG. 13A corresponds to the one moving plate 21 shown in FIG. 9, and it is supposed that a moving plate structured likewise is provided at the symmetrical side in the structure shown in FIG. 13A. An explanation will be given of a moving mechanism of a modified example based on the one moving plate 41.

The moving plate 41 has a rotaloading table pin 41a attached to an outward side thereof. A straight-motion rail 43 is provided in the vertical direction in accordance with the pin 41a of the moving plate 41. The straight-motion rail 43 has a rail size larger than or equal to a size in height relating to a carrying mode where the plurality of wafers W are covered by the shielding cover H shown in FIG. 3C, and when it is necessary to lift up the wafer W to the height of the loading surface 11d as shown in FIG. 12, a rail size larger than the height of the loading surface 11d is employed.

A moving unit 45 is attached to a rail groove 43a of the straight-motion rail 43, and the moving unit 45 can move along the rail groove 43a by a non-illustrated controller. Further, the moving unit 45 is provided with a motor (not illustrated) which is linked with the pin 41a of the moving plate 41 and rotates the pin 41a, and this motor has a rotation number controlled by the non-illustrated controller.

The moving plate 41 which is attached to the straight-motion rail 43 in the foregoing manner can form an ascending inclined surface and a descending inclined surface shown in FIGS. 13B and 13C. Specifically, as shown in FIG. 13B, rotation around the pin 41a is performed counterclockwise at a required angle in such a way that the end portion of the moving plate 41 at the downstream side of the carrying path T. As a result, the moving plate 41 forms an ascending inclined surface which rises toward the downstream side.

As shown in FIG. 13C, the moving unit 45 is lifted in such a way that the end portion of the moving plate 41 at the upstream side of the carrying path T, and rotation around the pin 41a is performed clockwise at a required angle, the moving plate 41 descends toward the downstream side, and forms a descending inclined surface continuous to the upper surface of the carrying path T. When the moving unit 45 is moved with the moving plate 45 leveled, the entire moving plate 41 in a horizontal state can move up and down.

Figure 14A:
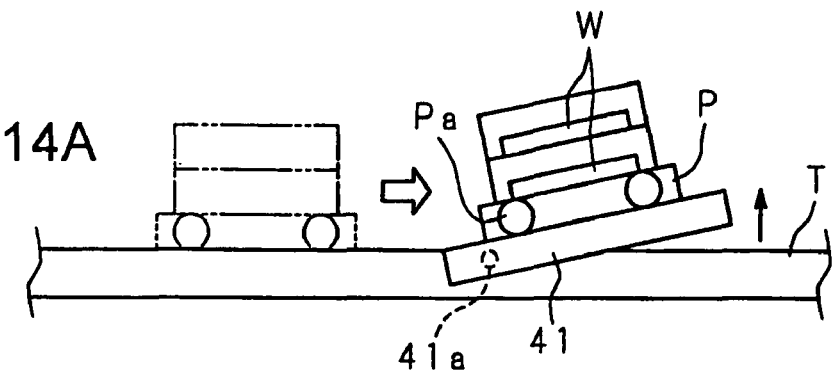
FIG. 14A is a top plan view showing a wafer running on the ascending inclined surface.
Figure 14B:
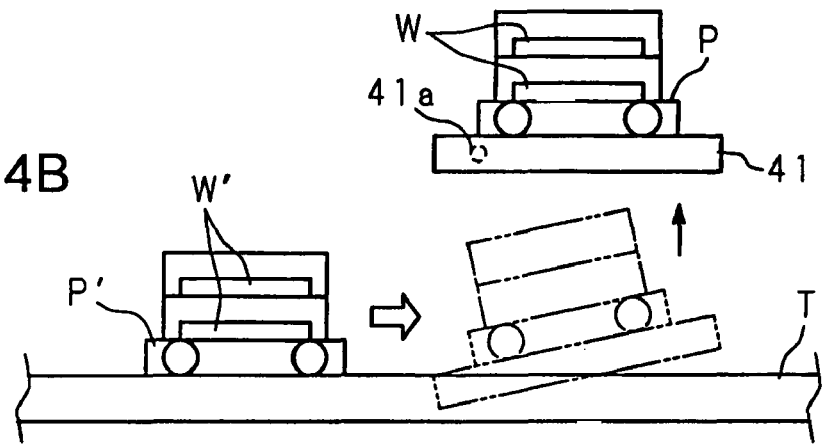
FIG. 14B is a top plan view showing the wafer moved to a position where a following wafer does not interfere.
Figure 14C:
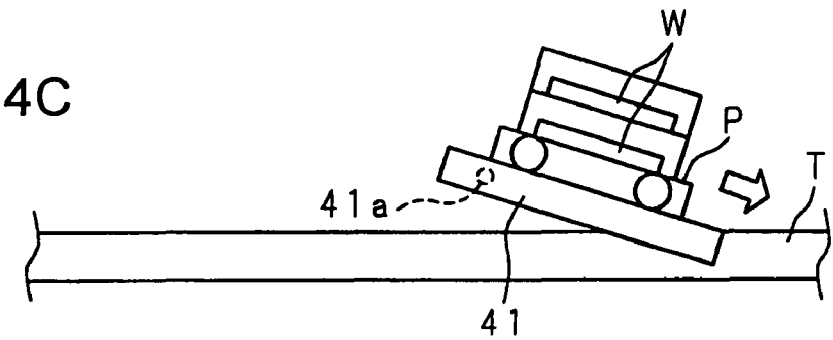
FIG. 14C is a top plan view showing the wafer sliding down the descending inclined surface.

The foregoing motion of the moving plate 41 is controlled as shown in FIGS. 14A to 14C based on the carried situation of the wafer W First, when the wafer W is picked up from the carrying path T, a descending inclined surface is formed by performing rotation around the pin 41a of the moving plate 41 counterclockwise. The counterclockwise rotation of the pin 41a is carried out based on detection by a sensor for detecting the pallet P which is not shown in FIG. 14A, and provided ahead of the moving plate 41. An angle that the pin 41a is rotated is set in such a way that the protrusive portion Pa of the pallet P carried through the carrying path T travels on the moving plate 41 through the ascending inclined surface to be formed by an inertia of carrying, and the pallet stays on the moving plate 41 and stops after traveling on the moving plate by a negative gravitational acceleration originating from the ascending inclined surface or an aggressive deceleration mechanism provided if the negative gravitational acceleration is not sufficient. The angle of the inclined surface is decided in consideration of the approaching speed of an object to be carried such that the acceleration in the vertical direction comes in within a predetermined value so that the object to be carried does not damage the wafer when traveling on the inclined surface.

As the moving plate 41 forms the ascending inclined surface, the pallet P of the wafer W carried by the carrying path T travels on the moving plate 41 from the carrying path T and stops. A sensor not shown in FIG. 14A detects that the pallet P stops on the moving plate 41. As the sensor detects it, as shown in FIG. 14B, the moving unit 45 is caused to move up and the moving plate 41 is rotated clockwise around the pin 41a, and the moving plate 41 is leveled and caused to ascend. Because of this ascending, the wafer W is moved to a position where another wafer W' loaded on the following pallet P' does not interfere.

Further, to return the wafer W moved above the carrying path T to the carrying path T, the non-illustrated sensor finds a vacant space in the carrying path beforehand, the wafer is once descended from the state in FIG. 14B in synchronization with the vacant space and stopped above the carrying path T, and from this state, as shown in FIG. 14C, the moving plate 41 is rotated clockwise around the pin 41a, a descending inclined surface with the end portion of the moving plate 41 at the downstream side being continuous to the upper surface of the carrying path T is formed.

As the moving plate 41 forms the descending inclined surface, the pallet P slides down the descending inclined surface by a gravitational acceleration and by a positive acceleration mechanism if the gravitational acceleration is insufficient because the carrying speed of the carrying path is so fast, at the same eventual speed as that of the carrying path, travels on the carrying path T, and then carried by the carrying path T. To transfer the pallet P on the carrying path T smoothly so as not to damage the wafer W, inclination of the moving plate 41 is controlled in such a way that an acceleration in the vertical direction when the pallet P is transferred on the carrying path is set within a predetermined value. After the wafer W is returned to the carrying path T, the moving plate 41 is moved so as not to cause an interference with the following wafer W.

Figure 15A:
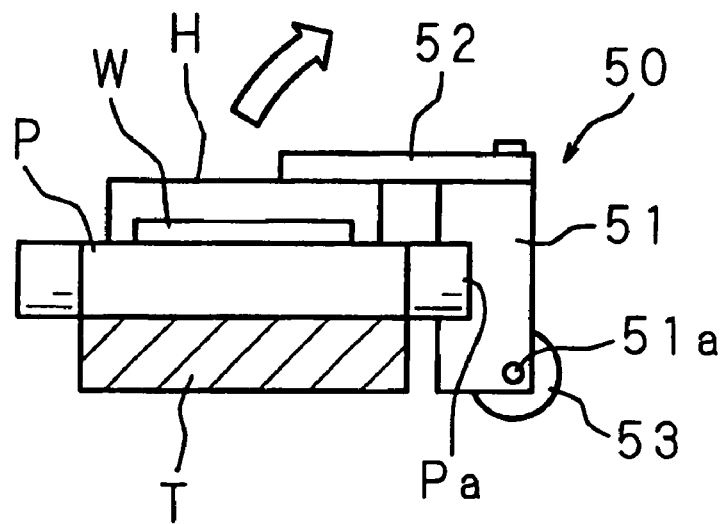
FIG. 15A is a schematic diagram showing a state where a wafer is held.
Figure 15B:
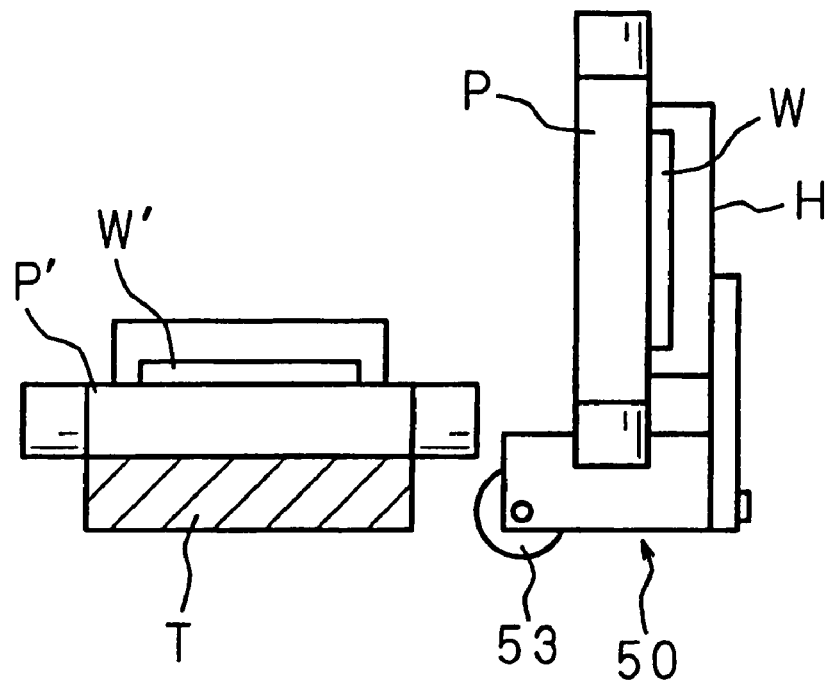
FIG. 15B is a schematic diagram showing a state where the wafer is retracted.

FIGS. 15A and 15B show the structure of another modified example which moves the wafer W to that position where no interference occurs, and are perspective views as viewed from the same direction as that of FIG. 3A. In this modified example, a 90-degree turn-over unit 50 is provided at one side of the carrying path T, and an actuator 53 which rotates a holding unit 51 and a guide plate 52 in the direction of an arrow in the figure around a rotation shaft 51a is provided.

The 90-degree turn-over unit 50 holds the protrusive portion Pa of the pallet P through the holding unit 51, and rotates the holding unit 51 and the guide plate 52 in the direction of the arrow in FIG. 15A at approximately 90 degree with the guide plate 52 holding down the upper surface of the shielding cover H which covers the wafer W. As a result, as shown in FIG. 15B, the pallet P, the wafer W, and the shielding cover H are retracted from the carrying path T, carrying through the carrying path T is performed without causing the wafer W' loaded on the following pallet P' to make an interference.

Figure 16A:
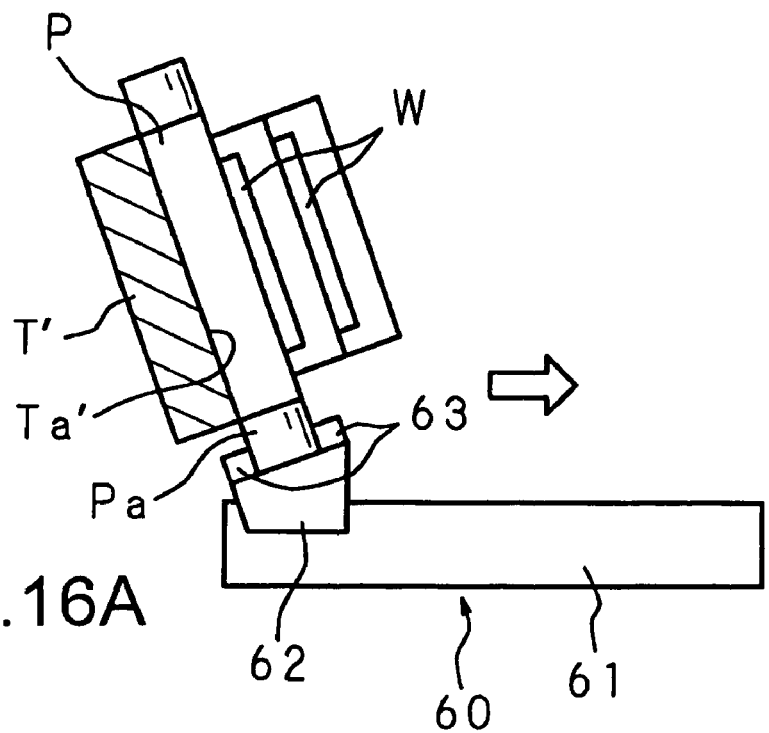
FIG. 16A is a schematic diagram showing a state where a wafer is held.
Figure 16B:
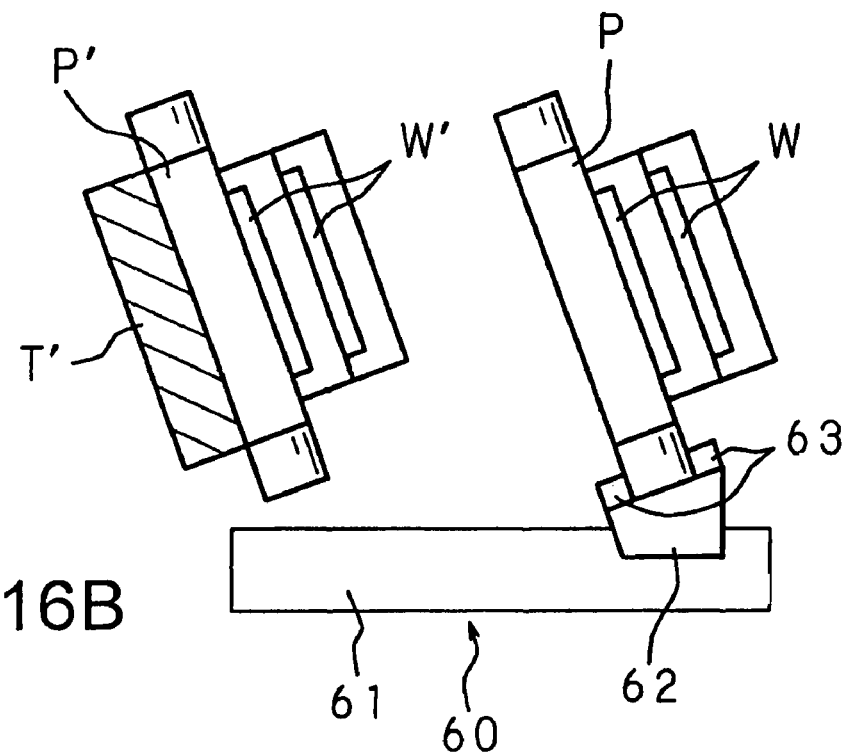
FIG. 16B is a schematic diagram showing a state where the wafer is retracted.

FIGS. 16A and 16B show the structure of the other modified example which causes the wafer W to move to a position where no interference occurs, and are perspective views as viewed from the same direction as that of FIG. 3A. In this modified example, a carrying path T' is laid out in such a way that a carrying surface Ta' inclines. A horizontal-motion device 60 of the wafer W is provided at one side of the carrying path T', and the horizontal-motion device 60 has a straight-motion rail 61 which is provided with a moving unit 62 in a movable manner and is provided horizontally, and the moving unit 62 has a chuck 63 which holds the protrusive portion Pa of the pallet P.

The horizontal-motion device 60 holds the protrusive portion Pa of the pallet P carried through the carrying path T' by the chuck 63, and in this state, the moving unit 62 is caused to move in the direction of an arrow in FIG. 16A. Then, as shown in FIG. 16B, the wafer W loaded on the pallet P is moved to position away from the carrying path T, and carrying by the carrying path T is performed without causing a wafer W' loaded on the following pallet P' to make an interference.

The carrying system 1 can perform atmosphere separation around the carrying path T covered by the cover 5 by a scheme other than pressurization of an inert gas shown in FIG. 4, and for example, a pump may be provided at the exhaust side to coercively inhale an air around the carrying path T and to exhaust outwardly, and atmosphere separation may be carried out by inhaling an inert gas and reducing a pressure around the carrying path T.

Figure 17A:
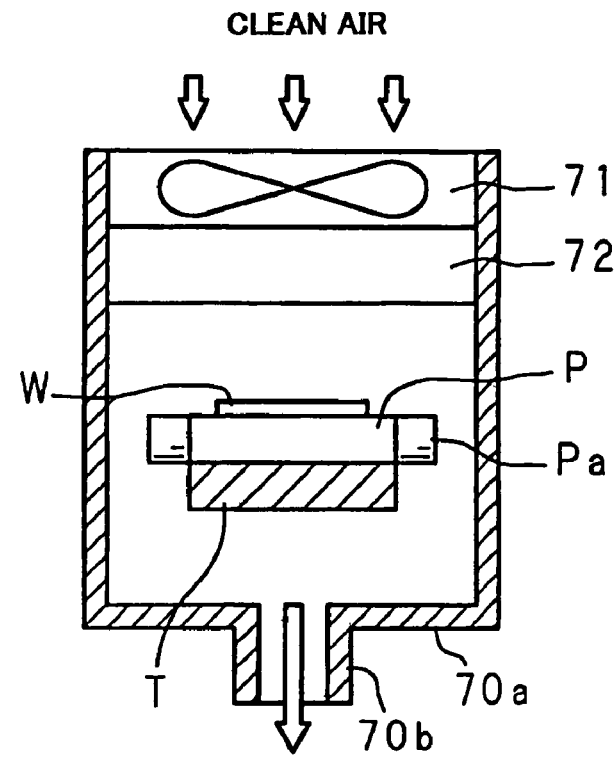
FIG. 17A is a cross-sectional view showing an embodiment of atmosphere separation by inhaling a clean air.

Further, as another scheme of atmosphere separation, as shown in FIG. 17A, a structure such that the upper portion of a cover 70 which covers the carrying path T is opened, an inhalation fan 71 and a filter 72 are provided at the upper portion, and an opening 70b for releasing an air is provided in a bottom plate 70a of the cover 70 can be employed. In the case of this structure, if filtering of dusts and cleaning of chemical components by the filter 72 are insufficient, a clean air from a clean air generation device (not shown) provided in the facility may be introduced through the fan 71, thereby achieving atmosphere separation in accordance with a predetermined clean degree. According to the atmosphere separation in FIG. 17A, airtightness in the cover 70 is not required, seal members elating to the flange 12c of the closing box 12 and the like shown in FIGS. 5A and 5B may be omitted.

Figure 17B:
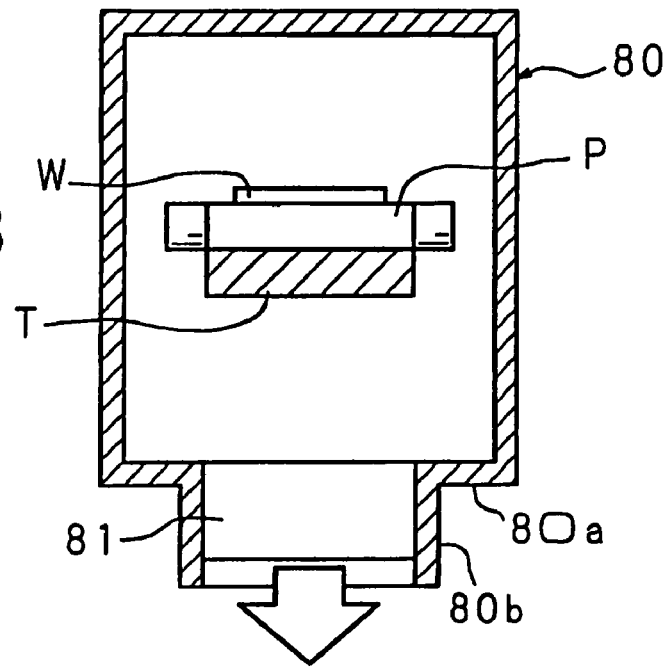
FIG. 17B is a cross-sectional view showing an embodiment of atmosphere separation by pressure reduction.

FIG. 17B shows the further other atmosphere separation scheme, and a structure such that a cover 80 covering the carrying path T is formed in a shape shielded other than a bottom surface 80a, an exhaust port 80b having a pump 81 inwardly provided at the bottom surface 80a is formed, and the exhaust port 80b is connected to a non-illustrated exhaust pipe is employed. In this example, as the interior space of the cover 80 is depressurized to a predetermined pressure by exhausting of the exhaust pump 81, the atmosphere in the cover 80 is separated from the external atmosphere, so that an atmosphere appropriate for carrying is maintained. This method is effective for suppressing change of the surface of the wafer in carrying by reducing the oxygen concentration and the concentration of water vapor in the cover 80. Further, according to this method, there is a problem such that when the interior space of the cover 80 is depressurized to less than or equal to a viscous flow region, it becomes difficult to eliminate dusts from the carrying mechanism by the flow of a clean gas, but in this case, a predetermined amount of inert gas or clean air is introduced from the upper portion of the cover 80 to cause a gas which is clean and has low oxygen and water vapor concentrations to flow, thereby eliminating the dust by the exhaust pump. The foregoing various atmosphere separation schemes can be omitted with respect to a case where the carrying path T is covered by the cover 5.

As shown in FIGS. 3A and 3C, in a case where atmosphere separation is performed for each wafer W loaded on the pallet P by the shielding cover H, the cover 5 which covers the carrying path T can be omitted. In this case, the wafer W covered by the shielding cover H is loaded on the pallet P and carried through the carrying path T which is surrounded by a structural object for ensuring safety that an airtight structure is not required, so that a cost necessary for constructing the carrying system can be reduced. According to the structure of this case, a lid is provided at the boundary defined by the rib 11e and the side wall rib 13a in the loading table 11 in the embodiment where the buffer Bf shown in FIGS. 5A and 5B are provided, or a lid is provided at the ascending position of the wafer W ascended by the perpendicular rail 25 (bottom position of the pallet indicated by solid line) in the embodiment where no buffer Bf is provided as shown in FIG. 12, the lid is structured as to be openable/closable in accordance with opening/closing of the cover of the pallet, the cover of the pallet is pressed against the lid to ensure the airtightness, and the lid and the cover are opened together.

This application is based on Japanese Patent Application No. 2004-310143 filed on Oct. 25, 2004. The specification, claims, and drawings of Japanese Patent Application No. 2004-310143 are entirely incorporated in this specification.

INDUSTRIAL APPLICABILITY

As mentioned above, the carrying system and the carrying method of the invention are useful for carrying various carrying targets, and the substrate treating device is useful for carrying a substrate and performing a treatment through a treating unit.

The invention claimed is:

1. A carrying system comprising a carrying path where carrying objects are successively carried single carrying object by single carrying object or plural carrying objects by plural carrying objects, and a loading table having one or a plurality of loading regions in a loading surface on which said carrying objects can be loaded, and wherein said carrying path is laid out below said loading surface of said loading table in such a manner as to run across a space region where a floor-occupying portion of said loading table is projected in a vertical direction; and the carrying system further comprises:

a moving unit which moves a carrying object, which is carried through said carrying path and passes through said space region, to that position where another carrying object does not interfere; and a room formed between the carrying path of an interior of the loading table and the loading surface, configured to retain the carrying objects and configured not to interfere with any of the carrying objects as the carrying objects are carried through the carrying path and as the carrying objects are loaded onto the loading surface.

2. The carrying system according to claim 1, wherein said carrying path can carry said carrying objects in a combined unit of carrying of a unit of singular carrying and a unit of plural carryings, and said moving unit is structured in such a manner as to move said carrying object by a moving length in accordance with a contour size relating to a unit of plural carryings.

3. The carrying system according to claim 1, further comprising a pallet which is carried through said carrying path, and wherein said carrying object is loaded on said pallet and carried through said carrying path, and said pallet has a cover which covers said carrying object to separate an atmosphere in said cover from a surrounding atmosphere.

4. The carrying system according to claim 1, further comprising a cover body which covers a moving range by said moving unit, and said carrying path.

5. The carrying system according to claim 1, wherein said carrying path is formed in an annular shape.

6. The carrying system according to claim 1, wherein an opening is formed in at least one loading region in said loading surface of said loading table, and the carrying system further comprises a closing body which can close said opening.

7. The carrying system according to claim 6, wherein said closing body is formed in a box shape whose at least bottom face is openable, and the carrying system further comprises a closing body moving unit which moves said closing body within a range from a position where said opening is closed by a top plate of said closing body to a position where said closing body protrudes upward said loading surface.

8. The carrying system according to claim 7, further comprising a storage box which can retain plural carrying objects thereinside, and wherein said closing body can retain said storage box thereinside, and the carrying system further comprises a moving unit which moves said storage box from a space below said loading surface in such a way that said storage box is retained in said closing body which is so positioned as to protrude upward said loading surface of said loading table.

9. The carrying system according to claim 8, further comprising transporter which transports a carrying object in such a way that said carrying object moved to that position where no interference occurs by said moving unit is retained in said storage box when said storage box is retained in said closing body which is so positioned as to protrude upward said loading surface of said loading table.

10. The carrying system according to claim 7, further comprising a storage box which can retain plural carrying objects thereinside, and wherein said closing body can retain said storage box thereinside, and the carrying system further comprises a moving unit which moves said storage box together with movement of said closing body by said closing body moving unit when said storage box is retained in said closing body.

11. The carrying system according to claim 7, wherein the closing body is in a box shape whose side wall is openable.

12. The carrying system according to claim 6, further comprising a unit which moves a carrying object moved to that position where no interference occurs by said moving unit to a height of said loading surface of said loading table.

13. The carrying system according to claim 1, wherein said moving unit has a unit which moves a carrying object carried through said carrying path obliquely upward a carrying direction.

14. The carrying system according to claim 1, further comprising a unit which forms an ascending inclined surface with a portion thereof at a downstream side of a carrying direction being as an upper end so that a carrying object carried through said carrying path travels on, and wherein said moving unit is structured in such a manner as to move said carrying object having traveled on said ascending inclined surface.

15. The carrying system according to claim 1, further comprising a unit which moves a carrying object moved to that position where no interference occurs obliquely downward a carrying direction of said carrying path and loading said carrying object on said carrying path.

16. The carrying system according to claim 1, further comprising a unit which forms a descending inclined surface with a portion thereof at a downstream side of said carrying direction being as a lower end so that a carrying object located at that position where no interference occurs is slid down to said carrying path.

17. A substrate treating device comprising:

a treating unit which performs a treatment on a substrate;

a casing which covers said treating unit; and a loading table which is disposed at one side face of said casing, and has a loading surface, wherein an opening through which a substrate as a predetermined object can pass is formed in said loading surface of said loading table; and a room formed between a carrying path of an interior of the loading table and the loading surface, configured to retain carrying objects and configured not to interfere with any of the carrying objects as the carrying objects are carried through the carrying path and as the carrying objects are loaded onto the loading surface.

18. The substrate treating device according to claim 17, wherein, the carrying path is located below said loading surface of said loading table in a space region where a floor occupying portion of said loading table is projected in a vertical direction; and a moving unit which moves one substrate, which is carried through said carrying path and passes through said space region, to a position where said one substrate does not interfere with another substrate.

* * * * *